United States Patent
Nam et al.

(10) Patent No.: US 9,842,659 B2
(45) Date of Patent: Dec. 12, 2017

(54) NON-VOLATILE MEMORY DEVICE FOR DETECTING PROGRESSIVE ERROR, MEMORY SYSTEM, AND METHOD OF OPERATING THE NON-VOLATILE MEMORY DEVICE

(71) Applicants: Sang-wan Nam, Hwaseong-si (KR); Byung-gil Jeon, Suwon-si (KR); Dae-seok Byeon, Seongnam-si (KR)

(72) Inventors: Sang-wan Nam, Hwaseong-si (KR); Byung-gil Jeon, Suwon-si (KR); Dae-seok Byeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/616,281

(22) Filed: Feb. 6, 2015

(65) Prior Publication Data

US 2015/0287479 A1    Oct. 8, 2015

(30) Foreign Application Priority Data

Apr. 7, 2014   (KR) ........................ 10-2014-0041498

(51) Int. Cl.
*G11C 11/34*   (2006.01)
*G11C 29/02*   (2006.01)
*G11C 29/12*   (2006.01)
*G11C 29/50*   (2006.01)

(52) U.S. Cl.
CPC .... *G11C 29/025* (2013.01); *G11C 2029/1202* (2013.01); *G11C 2029/5006* (2013.01)

(58) Field of Classification Search
CPC .......... G11C 29/025; G11C 2029/5006; G11C 2029/1202
See application file for complete search history.

(56) References Cited

U.S. PATENT DOCUMENTS

| | | |
|---|---|---|
| 6,385,090 B1 | 5/2002 | Kitazaki |
| 8,018,772 B2 | 9/2011 | Chen et al. |
| 8,085,609 B2 | 12/2011 | Shinoda |
| 8,379,454 B2 | 2/2013 | Kochar et al. |
| 8,432,737 B2 | 4/2013 | Shiga |
| 2002/0145907 A1* | 10/2002 | Byeon ............... G11C 29/02 365/185.11 |

(Continued)

FOREIGN PATENT DOCUMENTS

| | | |
|---|---|---|
| KR | 100596330 | 7/2006 |
| KR | 20090126715 A | 12/2009 |
| KR | 20110001086 A | 1/2011 |

*Primary Examiner* — Richard Elms
*Assistant Examiner* — Mohammed A Bashar
(74) *Attorney, Agent, or Firm* — Harness, Dickey, & Pierce, P.L.C.

(57) ABSTRACT

Provided are a non-volatile memory device, a memory system, and a method of operating the non-volatile memory device. The method includes: performing a user operation according to at least one mode selected from among a writing mode, a reading mode, and an erasing mode with respect to a memory cell array; setting up voltages of a plurality of word lines; floating at least one word line from among the plurality of word lines, the voltages of which are set up, according to the at least one selected mode; and detecting whether the at least one word line has a progressive defect, according to a result of detecting a voltage level of the at least one floated word line.

10 Claims, 22 Drawing Sheets

(56) References Cited

U.S. PATENT DOCUMENTS

| | | | |
|---|---|---|---|
| 2009/0316491 A1* | 12/2009 | Park | G11C 16/0483 365/185.29 |
| 2010/0125429 A1 | 5/2010 | Yamada | |
| 2012/0008410 A1 | 1/2012 | Huynh et al. | |
| 2013/0114342 A1* | 5/2013 | Sakai | G11C 29/025 365/185.17 |

* cited by examiner

I – I'

NON-VOLATILE MEMORY DEVICE FOR DETECTING PROGRESSIVE ERROR, MEMORY SYSTEM, AND METHOD OF OPERATING THE NON-VOLATILE MEMORY DEVICE

CROSS-REFERENCE TO RELATED APPLICATIONS

This application claims the benefit of Korean Patent Application No. 10-2014-0041498, filed on Apr. 7, 2014, in the Korean Intellectual Property Office, the disclosure of which is incorporated herein in its entirety by reference.

BACKGROUND

The inventive concept relates to a non-volatile memory device, and more particularly, to a non-volatile memory device for detecting a progressive error, a memory system, and a method of operating the non-volatile memory device.

A non-volatile memory device as a semiconductor memory includes a plurality of memory cells that store data. As an example of the non-volatile memory device, a flash memory device may be used in a mobile phone, a digital camera, a personal digital assistant (PDA), a mobile computing device, a fixed computing device, and other devices.

A flash memory device may have various types of bridges between word lines, between word lines and channels, and between word lines and common source lines due to its structure. Because of bridges, there may be a leakage current, and accordingly, user operations such as writing, reading, and erasing operations may have errors.

SUMMARY

The inventive concept provides a non-volatile memory device capable of preventing generation of data that may not be recovered by finding a progressive error such as a word line defect at an initial stage, a memory system, and a method of operating the non-volatile memory device.

According to an aspect of the inventive concept, there is provided a method of operating a non-volatile memory device, the method including: performing a user operation according to at least one mode selected from among a writing mode, a reading mode, and an erasing mode with respect to a memory cell array; setting up voltages of a plurality of word lines; floating at least one word line from among the plurality of word lines, the voltages of which are set up, according to the at least one selected mode; and detecting whether the at least one word line has a progressive defect, according to a result of detecting a voltage level of the at least one floated word line.

The memory cell array may include three-dimensional (3D) VNAND memory cells.

When the reading mode is performed, a post-pulse operation may be performed after finishing one or more sensing operations, and the at least one word line may be floated after performing the post-pulse operation.

When the reading mode is performed, a voltage difference between a selected word line and a unselected word line may be developed during a voltage setting section which follows a pre-pulse section, and the floating of the at least one word line may be performed before a sensing operation.

When the writing mode is performed, the method may further include analyzing a distribution of threshold voltages of memory cells that are connected to one or more word lines in a certain writing loop, wherein the progressive defect may be detected according to a distribution of slow cells determined based on a result of analyzing the distribution of the threshold voltages.

A plurality of regions may correspond to one word line, and when the slow cells may be concentrated in a certain region from among the plurality of regions, it is determined that the one word line has the progressive defect.

When the writing mode is performed, writing operations may be sequentially performed with respect to a plurality of word lines and a plurality of pages corresponding to one word line from among the plurality of word lines, and a voltage level of a floated word line is detected whenever a page from among the plurality of pages is programmed with respect to each of the plurality of word lines to detect a progressive defect.

When the erasing mode is performed, the memory cell array may be divided into at least two regions, to which word line voltages of different levels are respectively applied, and a progressive defect caused by a bridge between word lines from among the plurality of word lines may be detected according to a result of detecting a voltage level of the at least one floated word line.

When the erasing mode is performed, the method may further include, when an erasing loop is performed, analyzing a distribution of threshold voltages of memory cells that are connected to one or more word lines among the plurality of word lines, wherein, when the erasing loop is performed, the progressive defect may be detected according to a result of detecting a variation in a total number of memory cells in which verification failures have occurred in a same word line, or according to a result of comparing, among different word lines, a total number of memory cells in which verification failures have occurred.

The memory cell array may include a first memory block for storing user data and a second memory block for storing meta data, and a reliability mode may be selected for the detecting of whether a progressive defect is generated when the second memory block is accessed.

The non-volatile memory device may include a memory controller, and a signal representing a result of detecting of whether a progressive defect is generated may be provided to the memory controller.

The non-volatile memory device may include a memory controller and is connected to an external host, and a signal representing a result of the detecting of whether a progressive defect is generated may be provided to the host.

According to an aspect of the inventive concept, there is provided a non-volatile memory device including: a memory cell array connected to a plurality of word lines, and comprising a plurality of memory cells that are respectively connected to the plurality of word lines; a voltage generator providing the memory cell array with word lines voltages, when a user operation is performed according to at least one mode selected from among a writing mode, a reading mode, and an erasing mode with respect to the memory cell array; and a voltage level detector detecting a voltage level of at least one word line that is floated according to the at least one selected mode, and generating a detection result representing whether the at least one word line has a progressive defect.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
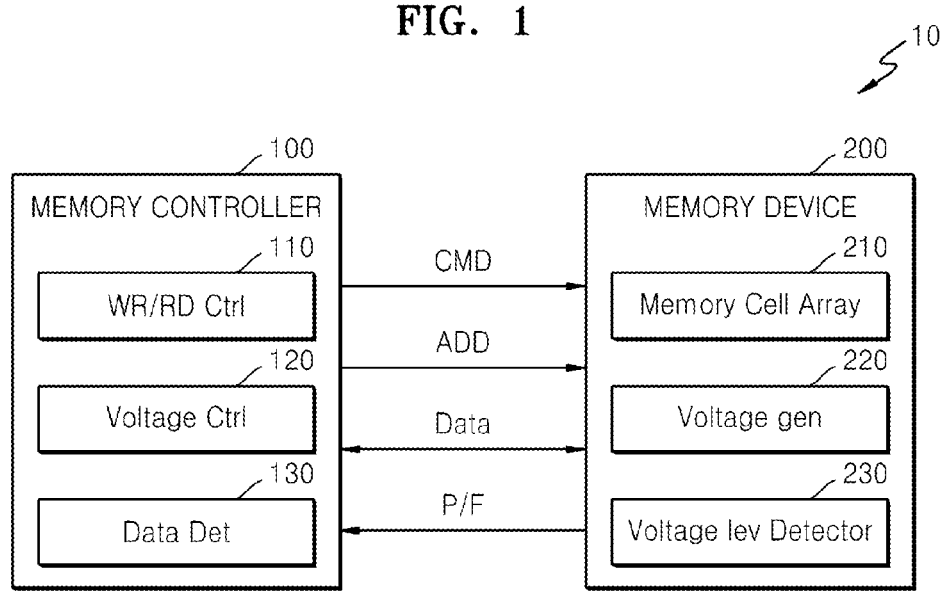
FIG. 1 is a block diagram of a memory system according to an embodiment of the present inventive concept.

Hereinafter, the inventive concept will be described more fully with reference to the accompanying drawings, in which exemplary embodiments of the inventive concept are shown. As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of the related art are omitted when it is deemed that they may unnecessarily obscure the essence of the invention.

The terms used in the present specification are merely used to describe particular embodiments, and are not intended to limit the present inventive concept. An expression used in the singular encompasses the expression of the plural, unless it has a clearly different meaning in the context. In the present specification, it is to be understood that the terms such as "including", "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 according to an embodiment of the present inventive concept.

Referring to FIG. 1, the memory system 10 may include a memory controller 100 and a memory device 200. The memory controller 100 performs controlling operations with respect to the memory device 200, for example, the memory controller 100 provides the memory device 200 with addresses ADD and commands CMD to control writing (or recording), reading, and erasing operations with respect to the memory device 200. Also, data for writing operations and data that is read may be transmitted between the memory controller 100 and the memory device 200.

The memory device 200 may include a memory cell array 210 and a voltage generator 220. The memory cell array 210 may include a plurality of memory cells that are arranged at locations where a plurality of word lines and a plurality of bit lines cross each other. The memory cell array 210 may include non-volatile memory cells that store non-volatile data, and may be, for example, flash memory cells such as a NAND flash memory cell array or a NOR flash memory cell array. Hereinafter, embodiments of the present inventive concept will be described under an assumption in which the memory cell array 210 includes flash memory cell arrays, and accordingly, the memory device 200 is a non-volatile memory device.

The memory controller 100 may include a writing/reading controller 110, a voltage controller 120, and a data determiner 130.

The writing/reading controller 110 may generate addresses ADD and commands CMD for performing writing, reading and erasing operations with respect to the memory cell array 210. Also, the voltage controller 120 may generate a voltage control signal for controlling at least one voltage level used in the non-volatile memory device 200. For example, the voltage controller 120 may generate a voltage control signal for reading data from the memory cell array 210, or controlling a voltage level of the word line for writing data to the memory cell array 210.

In addition, the data determiner 130 may perform a determination operation with respect to the data read from the memory device 200. For example, the data determiner 130 may determine the data read from memory cells connected to one or more word lines to determine the number of on-cells and/or off-cells from among the memory cells. As an example, if writing is performed with respect to a plurality of memory cells connected to one word line, states of data read from the memory cells are determined by a predetermined reading voltage so that it may be determined whether the writing is normally finished with respect to the all of the memory cells.

In addition, the memory device 200 may include the memory cell array 210, the voltage generator 220, and the voltage level detector 230. As described above, the memory cell array 210 may include non-volatile memory cells, for example, flash memory cells. Also, the flash memory cells may be realized in various types, for example, the memory cell array 210 may include three-dimensional (3D) (or vertical) NAND (VNAND) memory cells.

Examples of the memory cell array 210 will be described below with reference to FIGS. 3 through 6. The memory cell array 210 may include a plurality of memory blocks.

Figure 3:
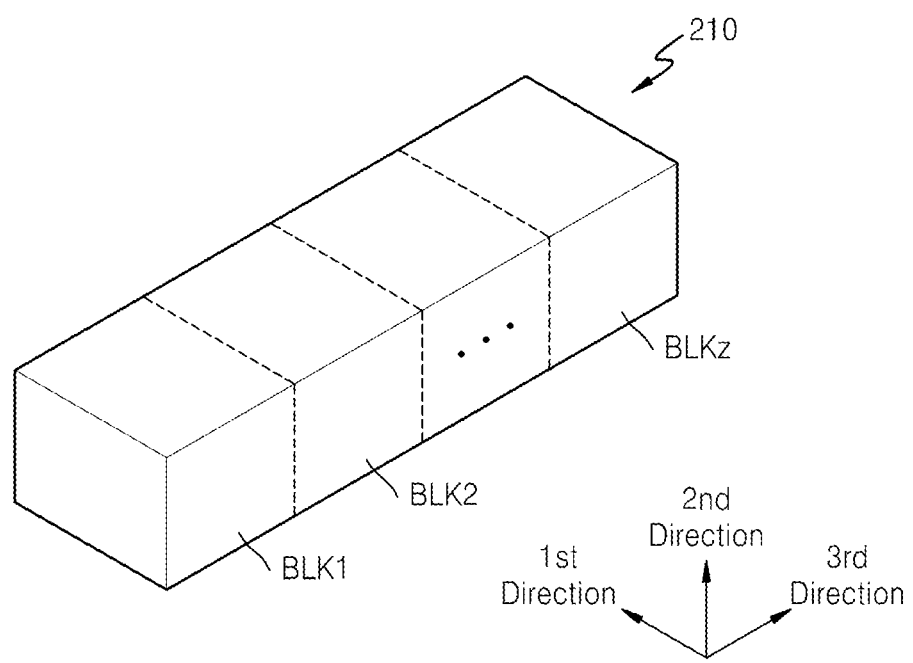
FIGS. 3 through 6 are diagrams showing examples of a memory cell array shown in FIG. 1.

FIG. 3 is a block diagram of the memory cell array 210 of FIG. 1. Referring to FIG. 3, the memory cell array 210 includes a plurality of memory blocks BLK1 through BLKz. Each of the memory blocks BLK1 through BLKz has a 3D structure (or vertical structure). For example, each memory block BLK includes structures (not shown) extending in first through third directions. For example, each memory block BLK includes a plurality of NAND strings NS (not shown) extending in a second direction. Otherwise, a plurality of NAND strings NS may extend in the first and third directions.

Each of the NAND strings NS is connected to a bit line BL, a string selection line SSL, a ground selection line GSL, word lines WL, and a common source line CSL. That is, each memory block BLK is connected to a plurality of bit lines BL, a plurality of string selection lines SSL, a plurality of ground selection lines GSL, a plurality of word lines WL, and the common source line CSL. The memory blocks BLK1 through BLKz will be described in detail below with reference to FIG. 4.

Figure 4:
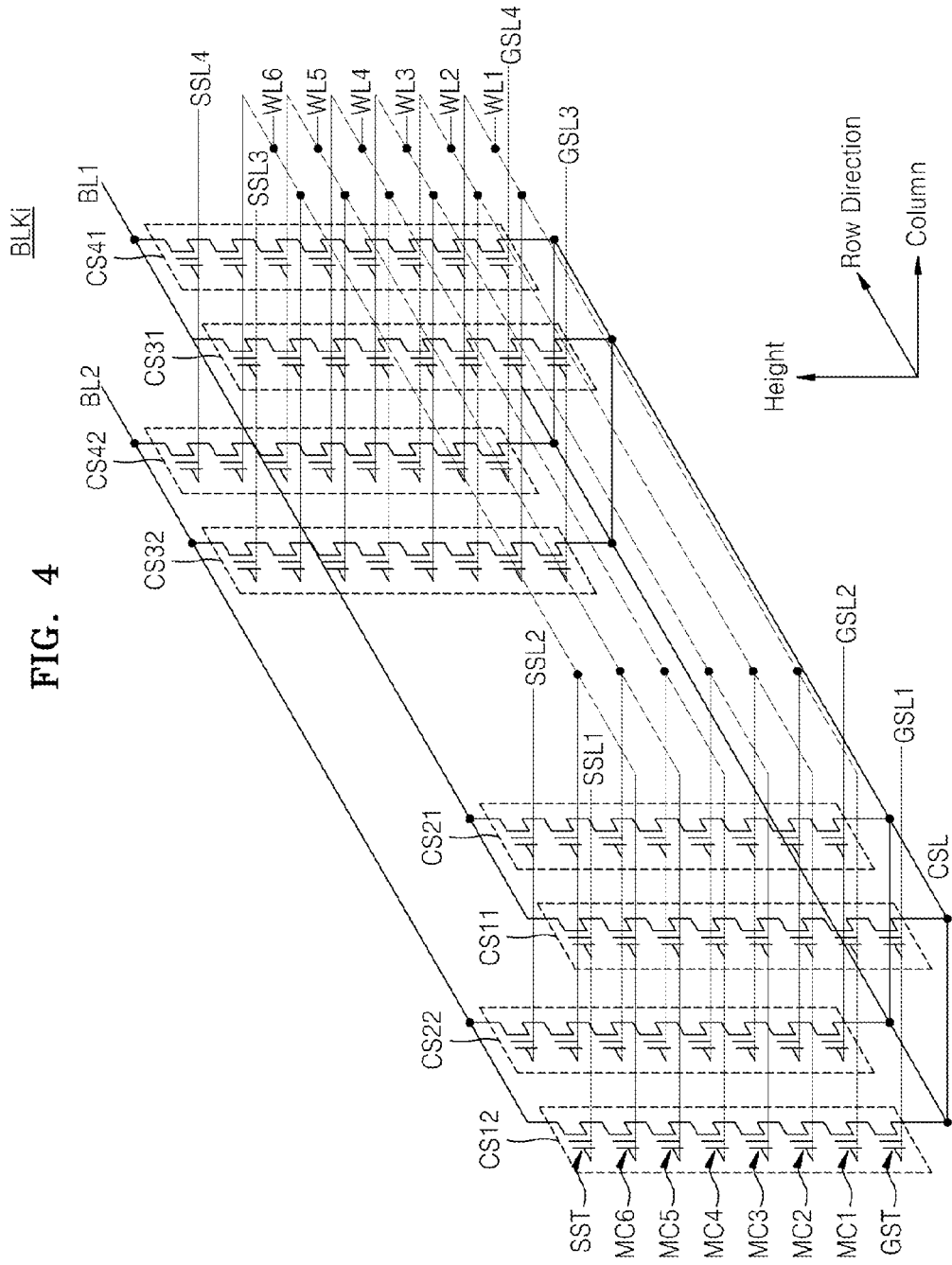

FIG. 4 is a circuit diagram of a memory block BLKi according to an embodiment of the present inventive concept. FIG. 4 shows one of the memory blocks BLK1 through BLKz in the memory cell array 210 shown in FIG. 3.

Referring to FIGS. 3 and 4, the memory block BLKi includes a plurality of cell strings CS11, CS21, CS31, CS41, CS12, CS22, CS32, and CS42. The plurality of cell strings CS11, CS21, CS31, CS41, CS12, CS22, CS32, and CS42 are arranged in a row direction and a column direction to form rows and columns.

Each of the cell strings CS11, CS21, CS31, CS41, CS12, CS22, CS32, and CS42 includes a ground selection transistor GST, memory cells MC1 through MC6, and a string selection transistor SST. The ground selection transistor GST, the memory cells MC1 through MC6, and the string selection transistor SST in each cell string CS may be stacked in a height direction, that is, a direction perpendicular to a substrate.

Rows of the plurality of cell strings CS11, CS21, CS31, CS41, CS12, CS22, CS32, and CS42 are respectively connected to different string selection lines SSL1 through SSL4. For example, the string selection transistors SST of the cell strings CS11 and CS12 are commonly connected to the string selection line SSL1. The string selection transistors SST of the cell strings CS21 and CS22 are commonly connected to the string selection line SSL2. The string selection transistors SST of the cell strings CS31 and CS32 are commonly connected to the string selection line SSL3. The string selection transistors SST of the cell strings CS41 and CS42 are commonly connected to the string selection line SSL4.

Columns of the plurality of cell strings CS11, CS21, CS31, CS41, CS12, CS22, CS32, and CS42 are respectively connected to different bit lines BL1 and BL2. For example, the string selection transistors SST of the cell strings CS11, CS21, CS31, and CS41 are commonly connected to the bit line BL1. The string selection transistors SST of the cell strings CS12, CS22, CS32, and CS42 may be commonly connected to the bit line BL2.

The rows of the plurality of cell strings CS11, CS21, CS31, CS41, CS12, CS22, CS32, and CS42 are connected to different ground selection lines GSL1 through GSL4. For example, the ground selection transistors GST of the cell strings CS11 and CS12 are commonly connected to the ground selection line GSL1. The ground selection transistors GST of the cell strings CS21 and CS22 are commonly connected to the ground selection line GSL2. The ground selection transistors GST of the cell strings CS31 and CS32 are commonly connected to the ground selection line GSL3. The ground selection transistors GST of the cell strings CS41 and CS42 are commonly connected to the ground selection line GSL4.

The memory cells located at the same height from the substrate (i.e., the ground selection transistors GST) are commonly connected to one word line, and the memory cells located at different heights from each other may be connected to different word lines WL1 through WL6. For example, the memory cells MC1 are commonly connected to the word line WL1. The memory cells MC2 are commonly connected to the word line WL2. The memory cells MC3 are commonly connected to the word line WL3. The memory cells MC4 are commonly connected to the word line WL4. The memory cells MC5 are commonly connected to the word line WL5. The memory cells MC6 are commonly connected to the word line WL6.

The ground selection transistors GST of the cell strings CS11, CS21, CS31, CS41, CS12, CS22, CS32, and CS42 are commonly connected to the common source line CSL.

The memory block BLKi shown in FIG. 4 is an example. That is, the technical gist of the present inventive concept is not limited to the memory block BLKi. For example, the number of rows in each of the cell strings CS11, CS21, CS31, CS41, CS12, CS22, CS32, and CS42 may be reduced or increased. As the number of rows in the each cell string changes, the number of the string selection lines SSL connected to the rows of the cell strings and the number of cell strings connected to one bit line may be changed. As the number of rows in the cell string is changed, the number of the ground selection lines GSL connected to the rows of the cell strings may be changed.

The number of columns in each of the cell strings CS11, CS21, CS31, CS41, CS12, CS22, CS32, and CS42 may be increased or reduced. As the number of columns in each cell string is changed, the number of bit lines connected to the columns of the cell strings and the number of cell strings connected to one string selection line may be changed.

The heights of the cell strings may be increased or reduced. For example, the number of memory cells stacked in each of the cell strings may be reduced or increased. As the number of memory cells stacked in each cell string is changed, the number of word lines may be also changed. For example, the number of string selection transistors or the ground selection transistors provided in each of the cell strings may be increased. As the number of the string selection transistors or the ground selection transistors provided in each cell string is changed, the number of string selection lines or ground selection lines may be changed. When the number of string selection transistors or ground selection transistors is increased, the string selection transistors or the ground selection transistors may be stacked like the memory cells MC1 through MC6.

Writing and reading operations may be performed by a row unit in each of the cell strings CS11, CS21, CS31, CS41, CS12, CS22, CS32, and CS42. The cell strings CS11, CS21, CS31, CS41, CS12, CS22, CS32, and CS42 are selected by the ground selection lines GSL1 through GSL4 by one row unit, and are selected by the string selection lines SSL1 through SSL4 by one column unit. Also, the voltage may be applied to at least two ground selection lines GSL1 and GSL2 or GSL3 and GSL4 from among the ground selection lines GSL1 through GSL4 as a unit. Otherwise, the voltage may be applied to all of the ground selection lines GSL1 through GSL4 as a unit.

In the selected row of each of the cell strings CS11, CS21, CS31, CS41, CS12, CS22, CS32, and CS42, the writing and reading operations may be performed by a page unit. A page may be a row of the memory cells connected to one word line. In the selected row of the cell strings CS11, CS21, CS31, CS41, CS12, CS22, CS32, and CS42, the memory cells may be selected by the word lines WL1 through WL6 in the page unit.

Figure 5A:
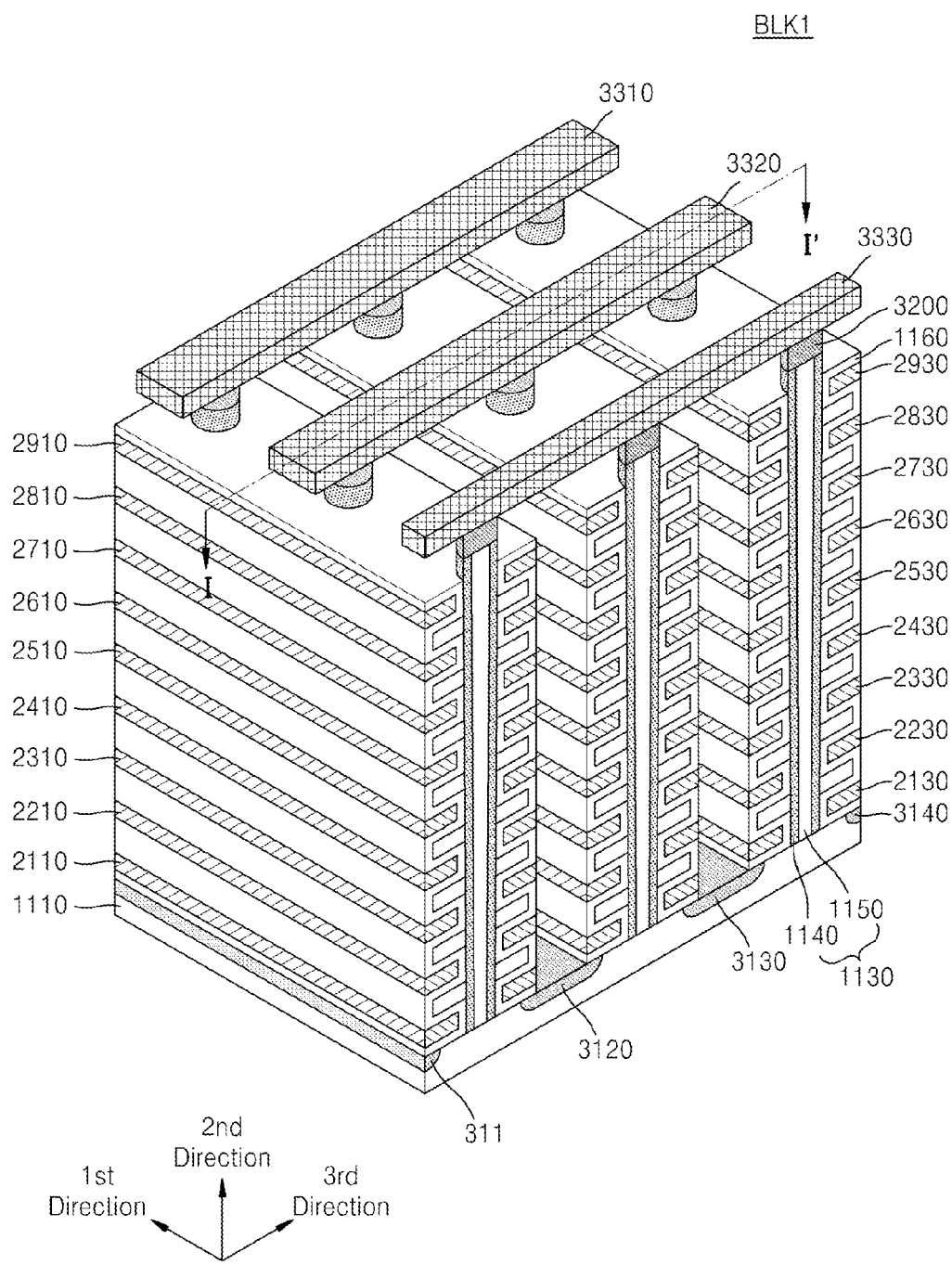
Figure 5B:
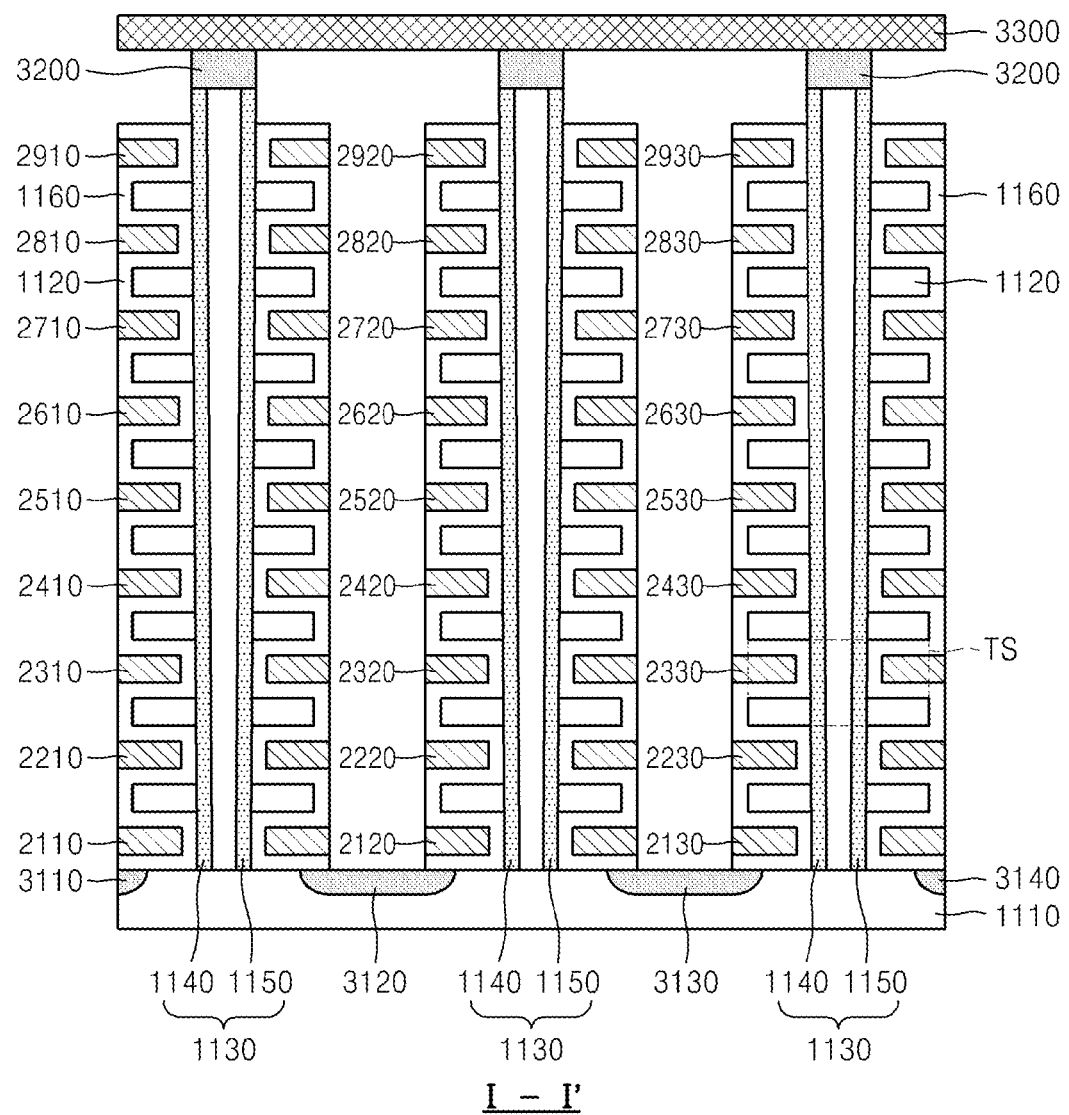

FIG. 5A is a perspective view of a first embodiment BLKi_1 having a structure corresponding to that of the memory block BLKi of FIG. 4. FIG. 5B is a cross-sectional view of the memory block BLKi_1 taken along line I-I' of FIG. 5A. Referring to FIGS. 5A and 5B, the memory block BLKi_1 includes structures extending in the first through third directions.

First, a substrate 1110 is provided. The substrate 1110 may include a silicon material doped with first type impurities, for example, p-type impurities. For example, the substrate 1110 may be a p-type well (pocket p-well). Hereinafter, it is assumed that the substrate 1110 includes the p-type silicon. However, embodiments of the present inventive concept are not limited thereto.

On the substrate 1110, a plurality of doping regions, that is, first through fourth doping regions 3110 through 3140, extending in a first direction are provided. For example, the plurality of doping regions 3110 through 3140 may be second types that are different from the substrate 1110, for example, the plurality of doping regions 3110 through 3140 may be n-type. Hereinafter, it is assumed that the first through fourth doping regions 3110 and 3140 are n-type. However, embodiments of the present inventive concept are not limited thereto.

On a space of the substrate 1110, which corresponds to a space between the first and second doping regions 3110 and 3120, a plurality of insulating materials 1120 extending in the first direction are sequentially provided in the second direction. For example, the plurality of insulating materials 1120 and the substrate 1110 may be spaced apart from each other by a predetermined distance that is set in advance along the second direction. For example, the plurality of insulating materials 1120 are spaced apart by the predetermined distance along the second direction. The insulating materials 1120 may include silicon oxide.

On the space of the substrate 1110, which corresponds to the space between the first and second doping regions 3110 and 3120, a plurality of pillars 1130 disposed sequentially in the first direction penetrate through the insulating materials 1120 in the second direction. For example, each of the plurality of pillars 1130 may be connected to the substrate 1110 after penetrating through the insulating materials 1120.

Each of the pillars 1130 may be formed of a plurality of materials. For example, surface layers 1140 of the each pillar 1130 may include a silicon material doped with impurities of the first type. For example, the surface layers 1140 of the pillar 1130 may include the silicon material doped with the impurities of the same type as that of the substrate 1110. Hereinafter, it is assumed that the surface layers 1140 in each pillar 1130 include p-type silicon. However, embodiments of the present inventive concept are not limited to the p-type silicon.

An internal layer 1150 in each pillar 1130 may be formed of an insulating material. For example, the internal layer 1150 in each pillar 1130 may include silicon oxide.

Between the first and second doping regions 3110 and 3120, an insulating layer 1160 is formed along with the insulating materials 112, the pillars 113, and the exposed surface of the substrate 1110. A thickness of the insulating layer 1160 may be less than ½ of a distance between the insulating materials 1120. That is, a space in which another material besides the insulating materials 1120 and the insulating layer 1160 may be disposed may be provided between the insulating layer 1160 provided on a lower surface of a first insulating material from among the insulating materials 1120 and the insulating layer 1160 provided on an upper surface of a second insulating material under the first insulating material.

Conductive materials 2110 through 2910 are provided on exposed surfaces of the insulating layer 1160 in the space between the first and second doping regions 3110 and 3120. For example, a conductive material 2110 extending in the first direction is provided between the insulating material 1120 that is adjacent to the substrate 1110 and the substrate 1110. In particular, the conductive material 2110 extending in the first direction is provided between the insulating layer 1160 on a lower surface of the insulating material 1120 that is adjacent to the substrate 1110 and the substrate 1110.

The conductive material extending in the first direction is provided between the insulating layer 1160 of an upper surface of a certain insulating material from among the insulating materials 1120 and the insulating layer 1160 on the lower surface of an insulating material disposed above the certain insulating material. For example, the plurality of the conductive materials 2210 through 2810 extending in the first direction are provided between the insulating materials 1120. Also, the conductive material 2910 extending in the first direction is disposed on the insulating materials 1120. For example, the conductive materials 2110 through 2910 extending in the first direction may be metal materials. Otherwise, the conductive materials 2110 through 2910 extending in the first direction may be polysilicon.

A structure that is the same as the structure between the first and second doping regions 3110 and 3120 may be provided between second and third doping regions 3120 and 3130. For example, the plurality of insulating materials 1120 extending in the first direction, the plurality of pillars 1130 sequentially disposed along the first direction and penetrating through the plurality of insulating materials 1120 in the third direction, the insulating layer 1160 formed on exposed surfaces of the plurality of insulating materials 1120 and the plurality of pillars 1130, and the plurality of conductive materials 2120 through 2920 extending in the first direction are disposed between the second and third doping regions 3120 and 3130.

A structure that is the same as that formed between the first and second doping regions 3110 and 3120 is formed between third and fourth doping regions 3130 and 3140. For example, the plurality of insulating materials 1120 extending in the first direction, the plurality of pillars 1130 sequentially disposed along the first direction and penetrating through the plurality of insulating materials 1120 in the third direction, the insulating layer 1160 formed on exposed surfaces of the plurality of insulating materials 1120 and the plurality of pillars 1130, and the plurality of conductive materials 2130 through 2930 extending in the first direction are disposed between the third and fourth doping regions 3130 and 3140.

Drains 3200 are formed on the plurality of pillars 1130. The drains 3200 may be formed of silicon materials doped with impurities of the second type, for example, n-type impurities. Hereinafter, it is assumed that the drains 3200 include the n-type silicon. However, embodiments of the present inventive concept are not limited thereto. A width of each of the drains 3200 may be greater than that of a corresponding pillar 1130. For example, each of the drains 3200 may be provided on an upper surface of the corresponding pillar 1130 as a pad.

Conductive materials 3310 through 3330 extending in the third direction are provided on the drains 3200. The conductive materials 3310 through 3330 are sequentially disposed along the first direction. Each of the conductive materials 3310 through 3330 may be connected to the drain 3200 of the corresponding region. The drains 3200 and the conductive material 3330 extending in the third direction may be connected to each other via a contact plug. The conductive materials 3310 through 3330 extending in the third direction may be metal materials. Otherwise, the conductive materials 3310 through 3330 extending in the third direction may be polysilicon.

In FIGS. 5A and 5B, each of the pillars 1130 may form a NAND string NS with the insulating layer 116 and the plurality of conductive lines 2110, 2210, . . . , 2910, 2120, 2220, . . . , 2920, 2130, 2230, . . . , and 2930 extending in the first direction. A transistor structure TS will be described in detail below with reference to FIG. 6.

Figure 6:
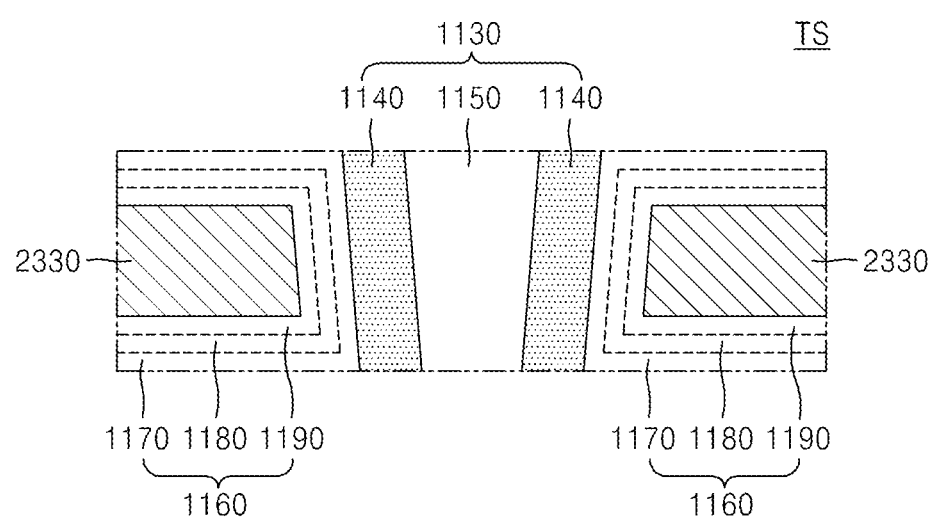

FIG. 6 is a cross-sectional view of the transistor structure TS of FIGS. 5A and 5B. Referring to FIGS. 5A, 5B, and 6, the insulating layer 1160 includes at least three, that is, first, second, and third sub-insulating layers 1170, 1180, and 1190.

The p-type silicon 1140 in each pillar 1130 may perform as a body. The first sub-insulating layer 1170 adjacent to the pillar 1130 may act as a tunneling insulating layer. The first sub-insulating layer 1170 adjacent to the pillar 1130 may include a thermal oxidation layer.

The second sub-insulating layer 1180 may act as a charge storing layer. For example, the second sub-insulating layer 1180 may perform as a charge capturing layer. The second sub-insulating layer 1180 may include a nitride layer or a metal oxide layer (for example, an aluminum oxide layer and a hafnium oxide layer).

The third sub-insulating layer 1190 that is adjacent to the conductive material 2330 may perform as a blocking insulating layer. The third sub-insulating layer 1190 adjacent to the conductive material 2330 extending in the first direction may be formed to have a single-layered or a multi-layered structure. The third sub-insulating layer 1190 may be a high-K layer (for example, an aluminum oxide layer and a hafnium oxide layer) having a dielectric constant that is greater than those of the first and second sub-insulating layers 1170 and 1180.

The conductive material 2330 may perform as a gate (or a controlling gate). That is, the gate (or the controlling gate) 2330, the blocking insulating layer 1190, the charge storing layer 1180, the tunneling insulating layer 1170, and the body 1140 form a transistor (or a memory cell transistor structure). The first through third insulating layers 1170, 1180, and 1190 may configure an oxide-nitride-oxide (ONO) structure. Hereinafter, the p-type silicon 1140 of the pillar 1130 may be referred to as a body in the second direction.

The memory block BLKi_1 may include the plurality of pillars 1130. That is, the memory block BLKi_1 may include a plurality of NAND strings NS. In more detail, the memory block BLKi_1 may include the plurality of NAND strings NS extending in the second direction (or a direction perpendicular to the substrate).

Each of the NAND strings NS includes a plurality of transistor structures TS arranged along the second direction. At least one of the plurality of transistor structures TS in each of the NAND strings NS acts as a string selection transistor SST. In addition, at least one of the plurality of transistor structures TS in each of the NAND strings NS acts as a ground selection transistor GST.

The gates (or controlling gates) correspond to the conductive materials 2110, 2210, . . . , 2910, 2120, 2220, . . . , 2920, 2130, 2230, . . . , and 2930 extending in the first direction. That is, the gates (or the controlling gates) extend in the first direction to form the word lines, and at least two selection lines (for example, at least one string selection line SSL and at least one ground selection line GSL).

The conductive materials 3310 through 3330 extending in the third direction are connected to one ends of the NAND strings NS. The conductive materials 3310 through 3330 extending in the third direction act as bit lines BL. That is, in one memory block BLKi_1, the plurality of NAND strings NS are connected to one bit line BL.

The second type doping regions 3110 through 3140 extending in the first direction are disposed on the other ends of the NAND strings NS. The second type doping regions 3110 through 3140 extending in the first direction act as common source lines CSL.

That is, the memory block BLKi_1 includes a plurality of NAND strings NS extending in the direction perpendicular to the substrate 1110 (second direction), and operates as a NAND flash memory block (for example, a charge capturing type) in which the plurality of NAND strings NS are connected to one bit line BL.

In FIGS. 5A, 5B, and 6, the conductive materials 2110, 2210, . . . , 2910, 2120, 2220, . . . , 2920, 2130, 2230, . . . , and 2930 extending in the first direction are provided through nine layers. However, embodiments of the present inventive concept are not limited thereto. For example, the conductive materials extending in the first direction may be provided through eight layers, sixteen layers, or other multiple layers. That is, in one NAND string NS, there may be eight transistors, sixteen transistors, or multiple transistors.

In FIGS. 5A, 5B, and 6, three NAND strings NS are connected to one bit line BL. However, the embodiments of the present inventive concept are not limited thereto. For example, in the memory block BLKi_1, m NAND strings NS may be connected to one bit line BL. Here, the number of conductive materials 2110, 2210, . . . , 2910, 2120, 2220, . . . , 2920, 2130, 2230, . . . , and 2930 extending in the first direction and the number of common source lines CSL 3110 through 3140 may be adjusted according to the number of NAND strings NS connected to one bit line BL.

In FIGS. 5A, 5B, and 6, three NAND strings NS are connected to one conductive material extending in the first direction. However, embodiments of the present inventive concept are not limited thereto. For example, n NAND strings NS may be connected to one conductive material extending in the first direction. The number of bit lines 3310 through 3330 may be adjusted according to the number of the NAND strings NS connected to one bit line BL.

As shown in FIGS. 5A, 5B, and 6, a width of the pillar 1130 varies depending on a height of the memory cell MC. The width of the pillar 1130 may be changed according to processing characteristics or errors. For example, when the height of the memory cell MC is reduced, that is, a distance between the string selection line SSL and the word line WL increases, the width of the pillar 1130 may be reduced.

The pillar 1130 includes the silicon oxide layer 1170 performing as the tunneling insulating layer, the silicon nitride layer 1180 performing as the charge storing layer, and the silicon oxide layer 1190 performing as the blocking insulating layer. An electric field is formed between the gate (or the controlling gate) and the body 1140 due to a voltage difference between the gate (or the controlling gate) and the body 1140. The electric field is distributed to the tunneling insulating layer 1170, the charge storing layer 1180, and the blocking insulating layer 1190.

The electric field distributed to the tunneling insulating layer 1170 causes Fowler-Nordheim tunneling. That is, the memory cell MC is programmed or erased by the electric field distributed to the tunneling insulating layer 1170. An amount of charges captured by the charge storing layer 1180 during the writing operation or an amount of charges discharged from the charge storing layer 1180 during the erasing operation may be determined by the electric field distributed to the tunneling insulating layer 1170.

The electric field is distributed to the tunneling insulating layer 1170, the charge storing layer 1180, and the blocking insulating layer 1190 based on capacitances of the tunneling insulating layer 1170, the charge storing layer 1180, and the blocking insulating layer 1190. When the width of the pillar 1130 is reduced, a ratio of an area of the tunneling insulating layer 1170 with respect to that of the blocking insulating layer 1190 is reduced. When the ratio of the area of the tunneling insulating layer 1170 with respect to that of the blocking insulating layer 1190 is reduced, a ratio of an electrostatic capacitance of the tunneling insulating layer 1170 with respect to that of the blocking insulating layer 1190 is also reduced. When the ratio of the electrostatic capacitance of the tunneling insulating layer 1170 with respect to that of the blocking insulating layer 1190 is reduced, the electric field distributed to the tunneling insulating layer 1170 increases.

Therefore, when the width of the pillar 1130 is reduced, the amount of charges captured in the charge storing layer 1180 in the writing operation and the amount of charges leaked from the charge storing layer 1180 in the erasing operation are increased. That is, a size of the tunneling effect varies depending on the width of the pillar 1130, and variation amounts in threshold voltages of the memory cells MC1 through MC7 are changed during the writing operation or the erasing operation. In order to compensate for the difference in the tunneling effect (or variation amount of the threshold voltage) according to the variation in the width of the pillar 1130, levels of the word line voltages may be adjusted.

Referring back to FIG. 1, the voltage generator 220 of the memory device 200 generates various kinds of voltages for performing writing/reading and erasing operations with respect to the memory array 210. For example, the voltage generator 220 may generate a string selection voltage provided to the word line of the string selection transistor SST, and may generate a dummy word line voltage provided to the word line of a dummy cell DC. Also, the voltage generator 220 may generate a normal word line voltage provided to the word line of normal cells NC, and may generate a ground selection voltage provided to the word line of the ground selection transistor GST. In addition, the voltage generator 220 generates the voltages of different levels and provides the word lines and bit lines with the voltages whenever the writing/reading and erasing operations are performed. When generating the voltages, the voltage generator 220 may be controlled by the voltage controller 120 of the memory controller 100.

According to the embodiment of the present inventive concept, the voltage level detector 230 of the memory device 200 is electrically connected to various voltage transferring paths to the memory cell array 210 to detect levels of the voltages. For example, the voltage level detector 230 may detect voltage levels of the voltage transferring paths of the above various voltages (the string selection voltage, the dummy word line voltage, the normal word line voltage, and the ground selection voltage) to detect whether a word line defect such as a leakage current may occur in any node in the voltage transferring paths. Also, the voltage level detector 230 generates a pass/fail signal (P/F) representing whether the word line is defective according to the detection result, and provides the P/F signal to the memory controller 100.

The word line defect may occur progressively. According to the structure of the 3D NAND flash, bridges may be generated between various word lines, the string selection lines, the ground selection lines, and the common source lines, and an electric current may leak via the bridges. According to the embodiments of the present inventive concept, the word line defect that occurs progressively may be found at an early stage, and accordingly, data loss generated due to an error that may not be recovered may be prevented. The method of detecting the word line defect is described according to the above description; however, the voltage level detector 230 may be connected to a bit line to detect a progressive defect of the bit line according to the embodiment of the present inventive concept.

Figure 2:
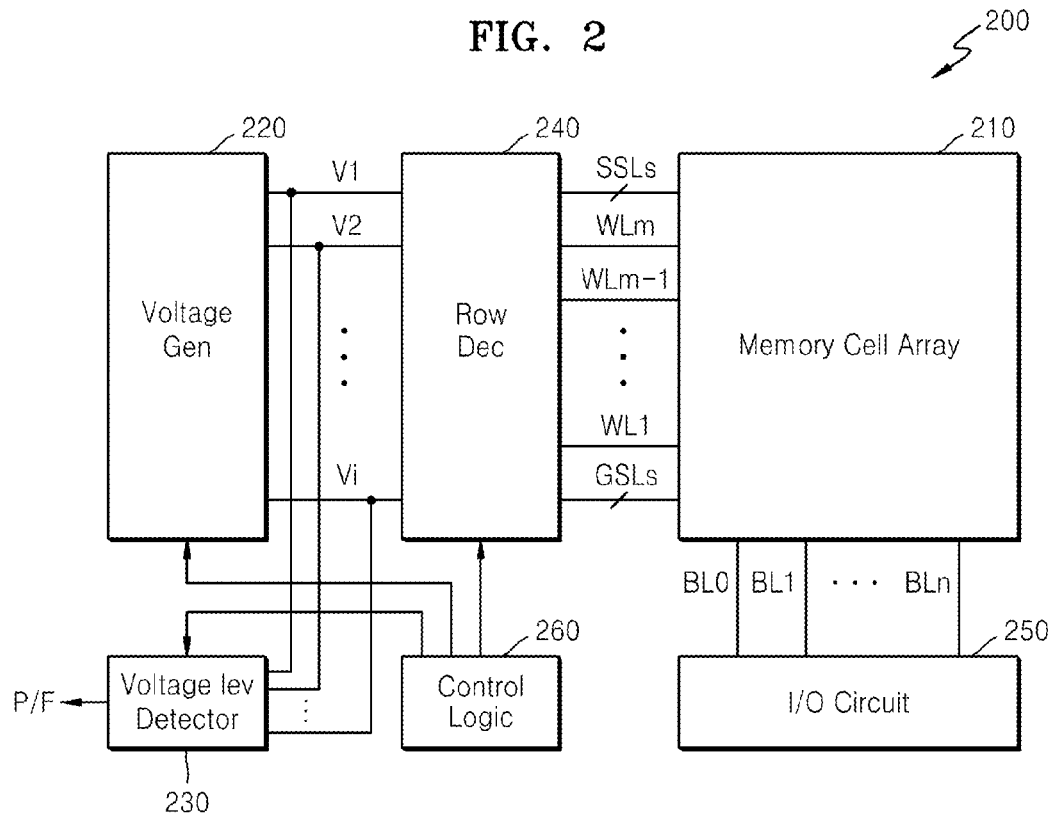
FIG. 2 is a block diagram of a memory device shown in FIG. 1.

FIG. 2 is a block diagram showing an example of the memory device 200 of FIG. 1. As shown in FIG. 2, the memory device 200 may include the memory cell array 210, the voltage generator 220, and the voltage level detector 230. Also, the memory device 200 may further include a row decoder 240, an input/output circuit 250, and a control logic 260.

The memory cell array 210 may be connected to one or more string selection lines SSLs, a plurality of word lines WL1 through WLm (including normal word lines and dummy word lines), and one or more ground selection lines GSLs, and may be connected to a plurality of bit lines BL1 through BLn. The voltage generator 220 may generate one or more word lines voltages V1 through Vi, and the word line voltages V1 through Vi may be provided to the row decoder 240. Also, data to be programmed may be provided to the memory cell array 210 via the input/output circuit 250, and data that is read may be provided to outside via the input/output circuit 250. The control logic 260 may provide various control signals related to the memory operations to the row decoder 240, the voltage generator 220, and the voltage level detector 230.

The voltage level detector 230 may be electrically connected to various word line voltage transferring paths. The word lines, the voltage levels of which are to be detected, include the normal word lines and the dummy word lines, and may include the string selection lines SSLs and the ground selection lines GSLs. Accordingly, when the embodiments of the present inventive concept are described, the word lines, the voltage levels of which are to be detected, may be defined to include the string selection lines SSL, the normal and dummy word lines, and the ground selection lines GSLs. Otherwise, the word lines may include the normal word lines and the dummy word lines, distinguished from the string selection lines and the ground selection lines. In addition, the voltage level detector 230 is electrically connected to an output terminal of the voltage generator 220 in FIG. 2; however, the embodiments of the present inventive concept are not limited thereto. For example, the voltage level detector 230 may be electrically connected to various word lines SSLs, WL1 through WLm, and GSLs included in the memory cell array 210 to detector word line defects.

According to the decoding operation of the row decoder 240, the word line voltages V1 through Vi may be provided to the various word lines SSLs, WL1 through WLm, and GSLs. For example, the word line voltages V1 through Vi may include the string selection voltages, the word line voltages, and the ground selection voltages, and the string selection voltages are provided to the one or more string selection lines SSLs, the word line voltages are provided to the one or more word lines (including the normal and dummy word lines) WL1 through WLm, and the ground selection voltages may be provided to the one or more ground selection lines GSLs. Progressive errors may occur in the word lines of the memory device 200, and the voltage level detector 230 detects the voltage levels of the word line voltages V1 through Vi and generates the P/F signal representing the word line defects.

Figure 7:
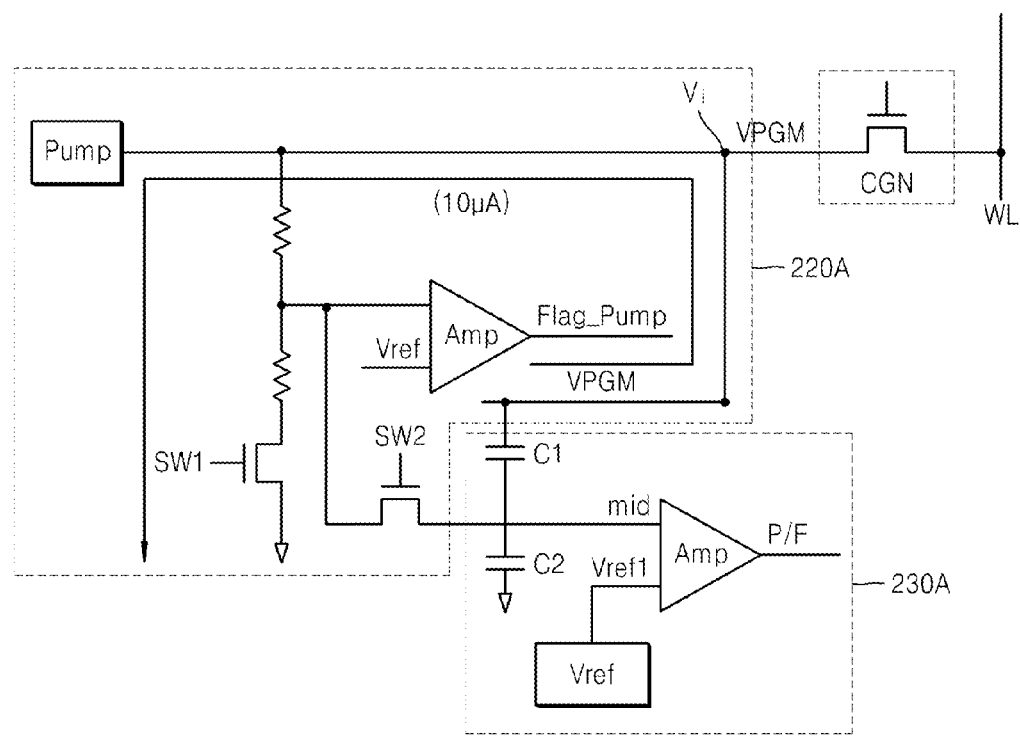
FIG. 7 is a circuit diagram of a voltage generator and a voltage level detector shown in FIG. 2.

FIG. 7 is a circuit diagram of the voltage generator and the voltage level generator of FIG. 2. FIG. 7 shows a partial structure of the voltage generator (for example, a word line voltage generator 220A generating the word lines voltages) and a voltage level detector 230A connected to the voltage generator 220A.

According to the circuit diagram of FIG. 7, a leakage of the word line may be detected. For example, a case where an output of a pump is necessary after setting up the voltage provided to the word line or a leakage occurs in the output of the voltage generator may be monitored. However, it is difficult to detect the word line defects that occur progressively only by using the circuit shown in FIG. 7. Thus, the word line defects that may occur progressively may be found under user operation environment according to the embodiments of the present inventive concept, and then, a way of dealing the defects may be provided.

Figure 8:
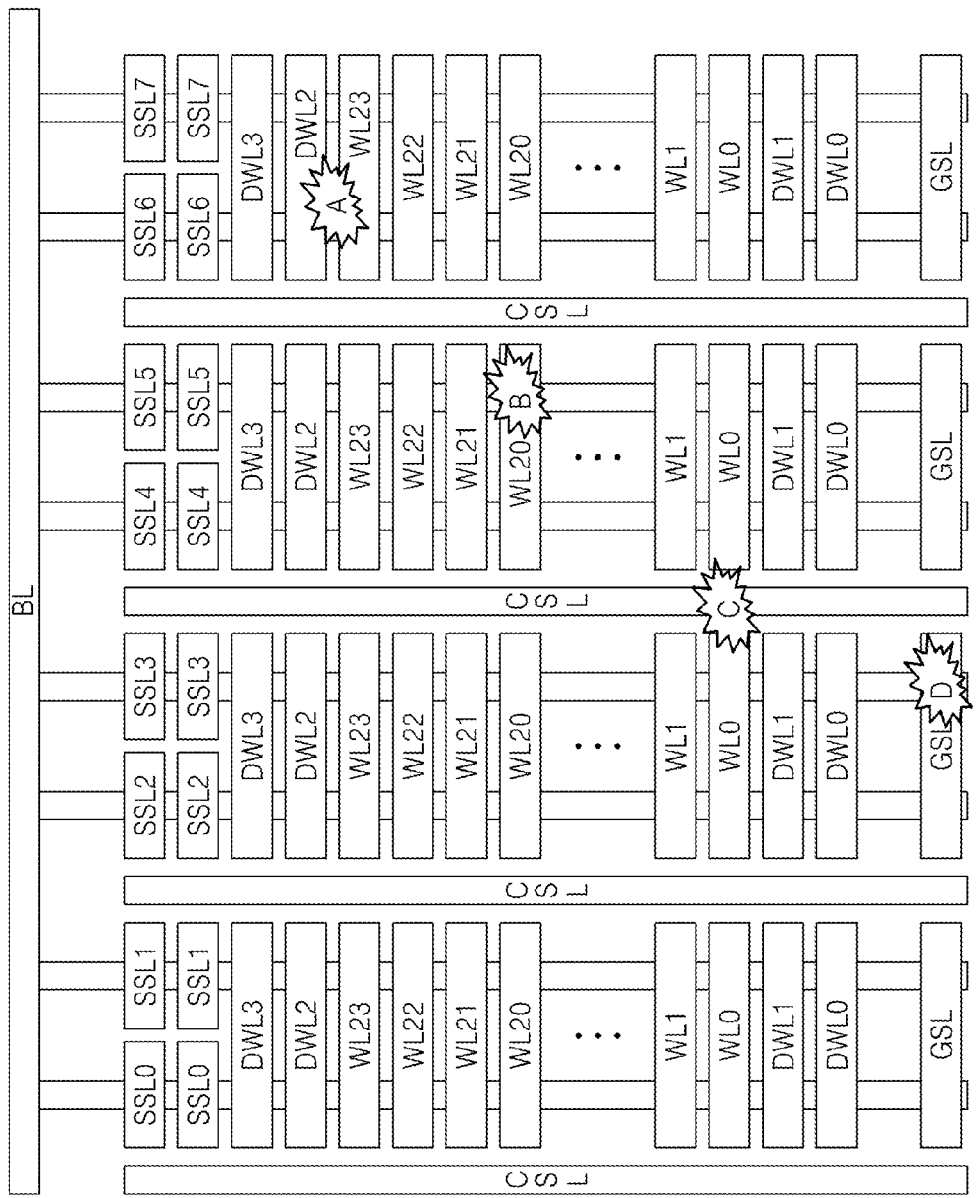
FIG. 8 is a block diagram showing examples of various progressive errors that may occur in a three-dimensional (3D) NAND flash.

FIG. 8 is a block diagram showing examples of various progressive defects that may occur in a 3D NAND flash. In FIG. 8, an example in which one GSL, two lower dummy word lines, 24 normal word lines, two upper dummy word lines, and two string selection lines SSLs are arranged from the bottom is shown. Also, a common source line CSL of a wall type that is disposed in parallel with the word lines may be provided as a source line of a vertical channel.

In FIG. 8, a defect A denotes a case where a bridge is generated between word lines, and the defect may occur progressively due to differences between biases of the upper and lower word lines during the writing or reading operation. Also, a defect B denotes a case where a bridge is generated between the word line and the channel, and a possibility of a bridge being generated between the word line and the channel is increased in the vertical NAND (VNAND) that is realized as a charge trap flash (CTF) cell. A defect C denotes a case wherein a bridge is generated between the word line and the common source line CSL, and a possibility of a defect being generated in the 3D structure is greater than that in a planar NAND. Also, a defect D denotes an example in which a bridge is generated between the ground selection line GSL, as well as the normal (or dummy) word line, and the channel or common source line CSL.

A method of detecting a progressive defect according to the embodiment of the present inventive concept will be described below.

Figure 9:
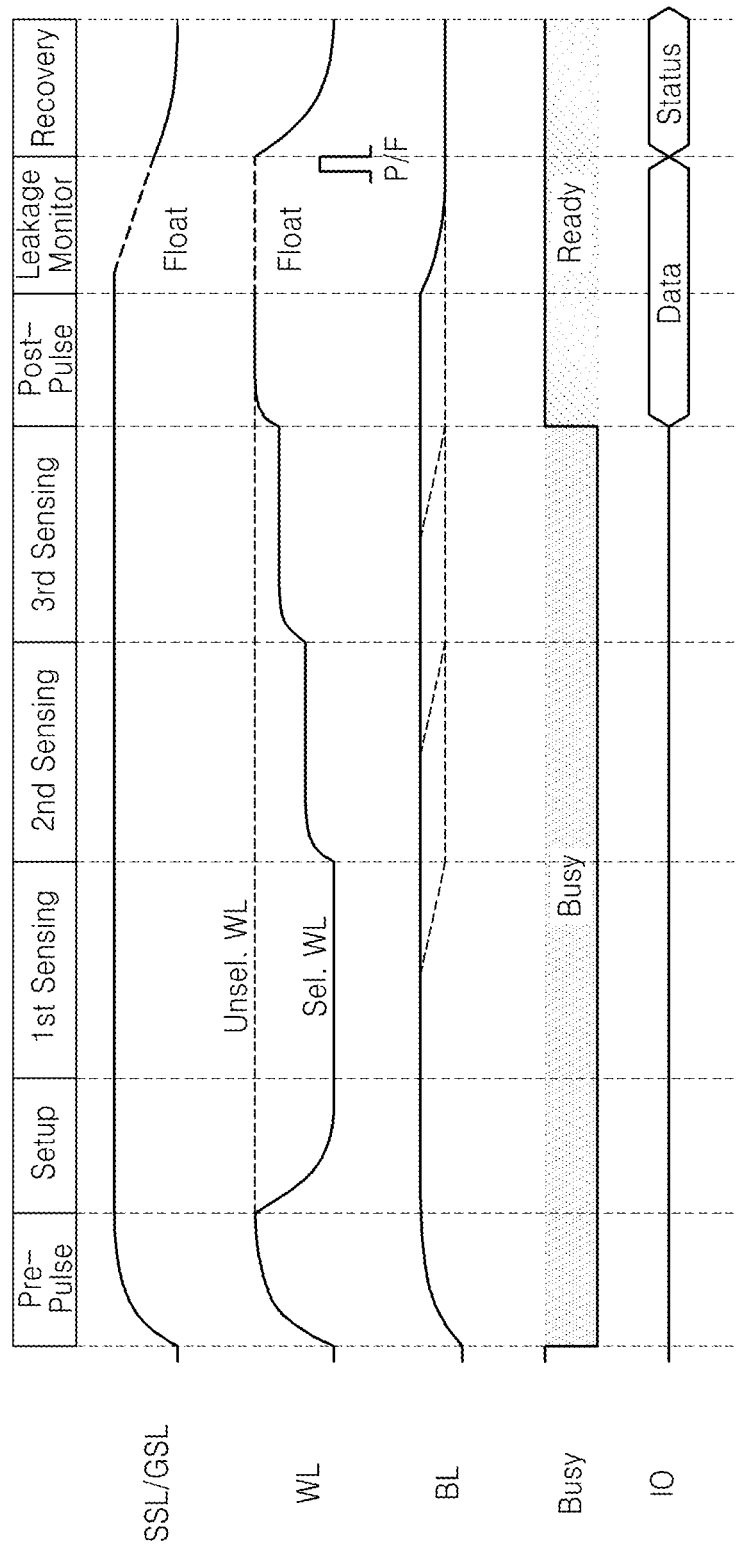
FIG. 9 is a waveform diagram illustrating a reading operation according to the embodiment of the present inventive concept.

FIG. 9 is a waveform diagram illustrating a reading operation according to the embodiment of the present inventive concept. In a VNAND, pre/post-pulses may be used to prevent boosting disturbance according to the reading voltage level (VREAD) in the string that is not selected, and a state of the memory device 200 is changed into a ready mode when data sensing is finished and the data is output from the input/output port.

In FIG. 9, an example of detecting the bridge between the word line (including the normal/dummy word line, the string selection line, and the ground selection line) and the channel in the reading operation is shown. As shown in FIG. 9, at least one leakage monitoring operation may be performed within the reading section. For example, the voltage levels of the string selection line SSL/the ground selection line GSL rise due to the pre-pulse operation, and at the same time, a voltage level of the normal word line WL is set up. The voltage levels of the unselected word lines WL rise to the read voltage VREAD level, and the voltage levels of the selected word lines WL may rise step-by-step according to the sensing operation. Since the voltages of the word lines WL are set up, at least one sensing operation is performed, for example, a plurality of sensing operations may be performed when data of a plurality of bits is stored in one memory cell. If a sensing operation is performed three times, a post-pulse operation is performed after finishing the sensing operations so that the voltage levels of all of the word lines are set up. In addition, after setting the voltage levels, the leakage monitoring operation may be performed. Since the data that is already read is output through the input/output port, degradation of the reading operation does not occur.

When performing the leakage monitoring operation, the word lines, the sensing operations of which are finished, enter a floating state, and the leakage level may be monitored by detecting the read voltage VREAD level from the word lines. The voltage level detector may detect the voltage levels of the word lines, and may provide a P/F signal according to the detection result to the memory controller via the input/output port.

Also, the voltage level detector may be disposed to correspond to each of the normal/dummy word lines, the string selection lines, and the ground selection lines. In this case, the leakage monitoring may be performed for each of the word lines so that it may be identified whether the leakage occurs from the normal word line, the string selection line, or the ground selection line. In addition, information about the word line, the leakage from which is detected, may be further provided to the memory controller. Otherwise, one voltage level detector may sequentially perform the voltage level detecting operation with respect to the plurality of word lines.

Figure 10:
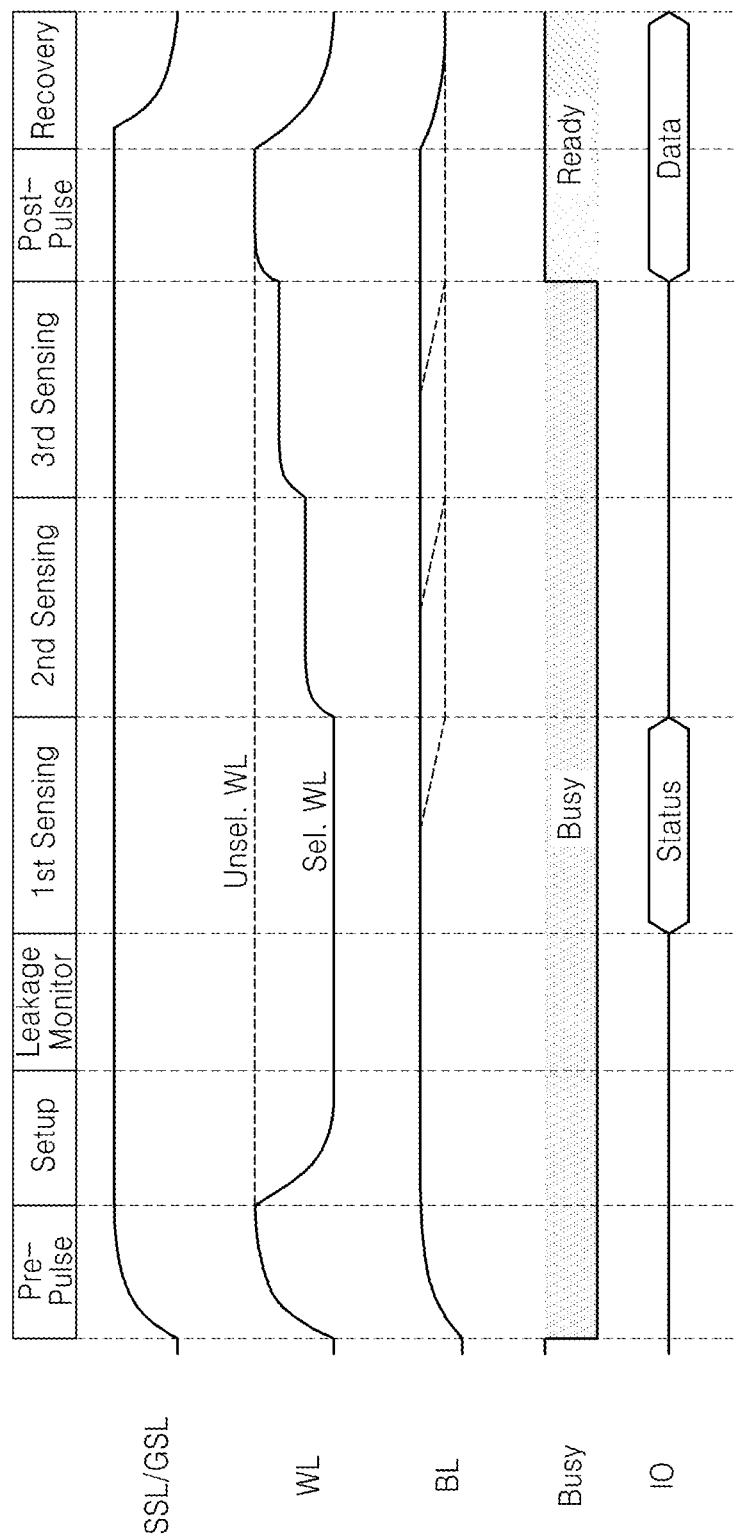
FIG. 10 is a waveform diagram illustrating a method of detecting a bridge between the word lines in the reading operation.

FIG. 10 is a waveform diagram illustrating a method of detecting a bridge between the word lines in the reading operation.

The voltage levels of the string selection line SSL/the ground selection line GSL rise due to the pre-pulse operation, and at the same time, the voltage level of the normal word line WL also rises (for example, rises to the read voltage VREAD). After that, a voltage difference is developed between the unselected word line and the selected word line during the setting section, and accordingly, the unselected word line is maintained at the read voltage VREAD level, whereas the selected word line is maintained at a relatively low voltage level with respect to the read voltage VREAD level.

After the setting section, the leakage monitoring operation may be performed. For example, the selected word lines and the unselected word lines are changed into floating states during the leakage monitoring section, and it may be detected whether the bridge is generated by detecting the voltage levels from the word lines. If there is a bridge between the selected word line and the unselected word line, the voltage level of the selected word line may increase to the current leakage, and the voltage level of the unselected word line may decrease. According to the voltage level detection result, the P/F signal may be provided via the input/output port, for example, the P/F signal may be provided to the memory controller before the data that is read is provided.

Figure 11:
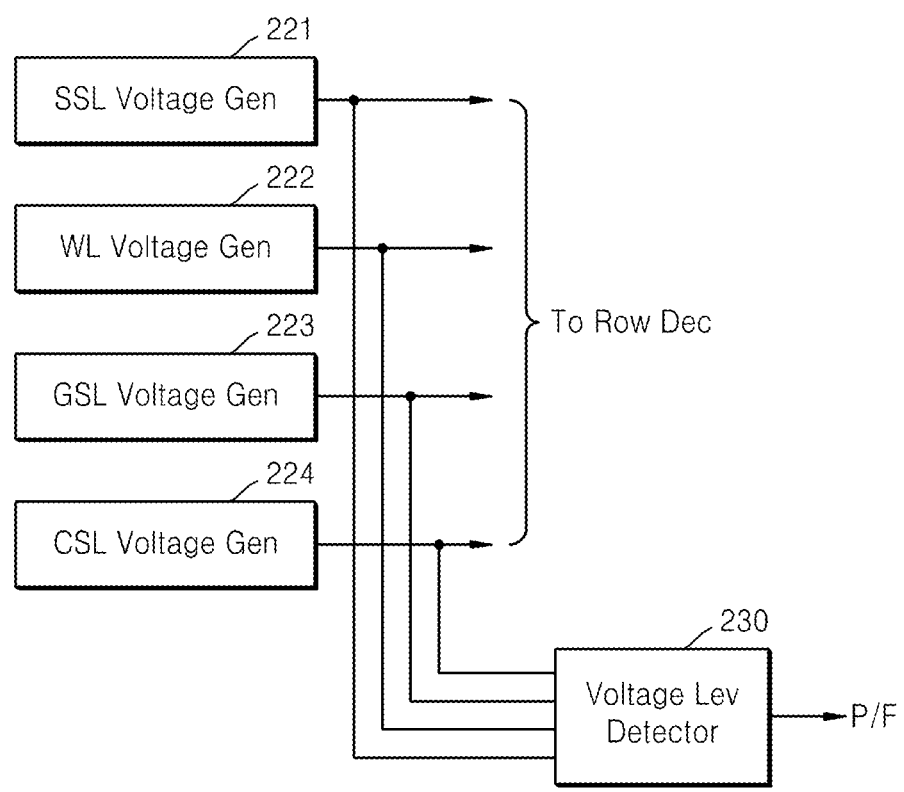
FIGS. 11 and 12 are block diagrams showing examples of the voltage level detector.
Figure 12:
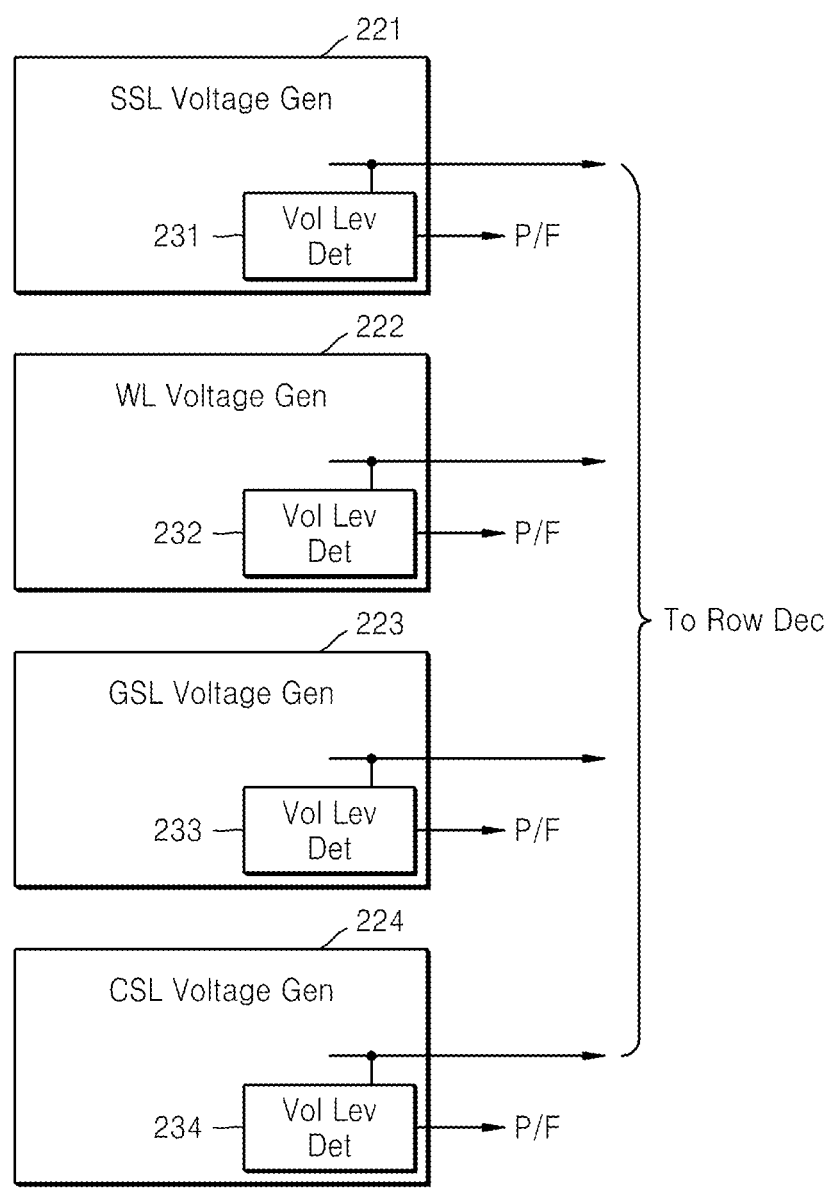

FIGS. 11 and 12 are block diagrams showing examples of the voltage level detector. As described above, since the voltage level detector is electrically connected to the string selection line SSL, the dummy word line, the normal word line, and the ground selection line, the leakage monitoring operation may be performed.

As shown in FIG. 11, in order to provide the word lines of the memory cell array with the word line voltages, a string selection voltage generator 221, a word line voltage (including dummy word lines and normal word lines) generator 222, a ground selection voltage generator 223, and a common source voltage generator 224 may be provided in the memory device 200. The word line voltages generated by the voltage generators 221 through 224 may be provided to the word lines via the row decoder. Also, the voltage level detector 230 may be disposed to be shared by the voltage generators 221 through 224, and the voltage level detector 230 may be electrically connected to outputs of the voltage generators 221 through 224. The voltage level detector 230 may output a P/F signal according to a result of detecting the output voltage levels of the voltage generators 221 through 224.

The voltage level detector 230 may sequentially perform monitoring operations with respect to the output voltages of the voltage generators 221 through 224. For example, when the word lines are floated after setting the word line voltages up, the voltage level detector 230 detects the voltage level from each of the word lines and generates a detection result. Also, as described above, the voltage level detector 230 may further generate information about the kind of the word line (string selection line, normal/dummy word lines, or the ground selection line) that is currently monitored.

FIG. 12 shows a modified example, in which the voltage level detector is provided in each of the plurality of voltage generators. For example, the voltage level detector 231 is disposed in the string selection voltage generator 221 to detect the level of the voltage provided to the string selection line. Also, the voltage level detector 232 may be disposed in the word line voltage generator 222 to detect the level of the voltage provided to the word line. Also, the voltage level detector 233 may be disposed in the ground selection voltage generator 223 and the voltage level detector 234 may be disposed in the common source voltage generator 224, and accordingly, the level of the voltage provided to the ground selection line and the level of the voltage provided to the common source line may be detected. Each of the voltage level detectors 231 through 234 may output a P/F signal according to the detection result, and the P/F signal may be provided to the memory controller.

Figure 13A:
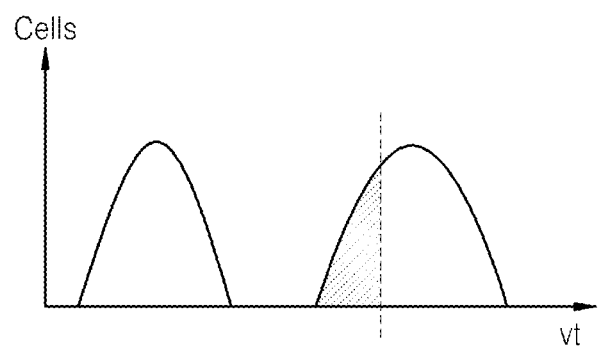
FIGS. 13A and 13B are graphs of a method of detecting a progressive word line defect during a writing operation.
Figure 13B:
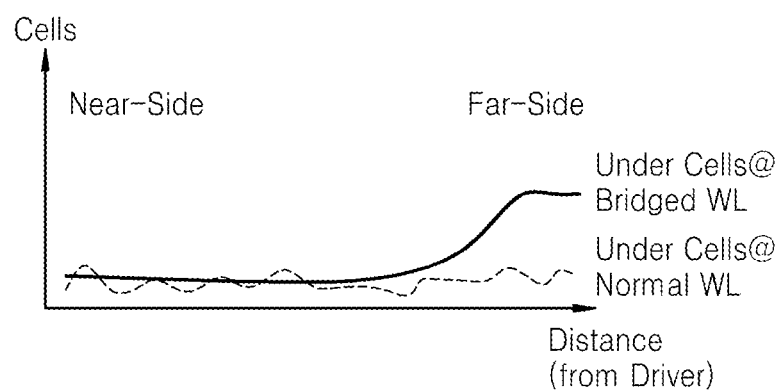

FIGS. 13A and 13B are graphs of a method of detecting a progressive word line defect during a writing operation.

Cell distribution is generated according to the writing operation, and cells having low threshold voltages (for example, slow cells) exist in the cell distribution according to the processing characteristics. The slow cells that may be generated according to the processing characteristics may be evenly distributed throughout all of the word lines. However, if there is a bridge between the word line, the channel, the common source line CSL, or the like and the writing operation may not be performed properly, errors mainly occur around the defects corresponding to the bridge or in a direction away from a driver (or row decoder) and in the location where the corresponding defect is generated.

According to the embodiments of the present inventive concept, the distribution of the memory cells is checked during the writing operation to detect whether a progressive defect occurs. For example, a plurality of writing operations may be performed in order to record data of multi-bits, and after a first writing operation or after a certain writing operation, the distribution of the memory cells is checked to determine whether locations of the cells (slow cells), threshold voltages of which are equal to or lower than a certain voltage (for example, a reference voltage), are in a certain location type. If the locations of the slow cells are in the certain location type, information representing that the word line leakage defect has occurred due to the bridge may be output to the outside, and then, the writing operation is stopped to prevent occurrence of the defect in advance.

In the example of FIGS. 13A and 13B, the number of slow cells and the locations thereof are determined after performing a first writing operation. An operation of analyzing the distribution of the memory cells may be performed in the data determiner 130 shown in FIG. 1. That is, the number and locations of the slow cells may be determined by analyzing a value of data (0 or 1) read from the memory device after a predetermined writing operation. As shown in FIG. 13B, the slow cells are evenly distributed in the word lines, in which no bridge is generated; however, if a bridge is generated at a certain location among the word lines, the number of slow cells rapidly increases from the certain location.

As another embodiment, the data of one word line may include a plurality of Error Correction Code (ECC) sectors. For example, the data of one word line is 8 kB, eight ECC sectors, each having a size of 1 kB, may be included. The locations of the slow cells may be determined by analyzing differences between bit error rates (BER) of the ECC sectors, or by counting the number of on-cells through a physical read bit map matching. Such operations above may be performed during the programming operation or after finishing the programming operation.

In a case of 3D NAND, the programming operations may be performed with respect to the memory cells connected to the dummy word lines, the ground selection lines, and the string selection lines, as well as the normal word lines. Accordingly, the progressive defects may be determined by analyzing distribution of the memory cells connected to the dummy word lines, the ground selection lines, and the string selection lines. In particular, the ground selection lines and the string selection lines correspond to a transferring path of boosting charges, and thus, an error of increasing a threshold voltage due to hot carrier injection (HCI) easily occurs. Therefore, it may be determined whether there is a progressive defect by determining whether the distribution of the cells connected to the ground selection lines and the string selection lines exceeds a predetermined window or determining the difference between the ECC sectors.

Figure 14:
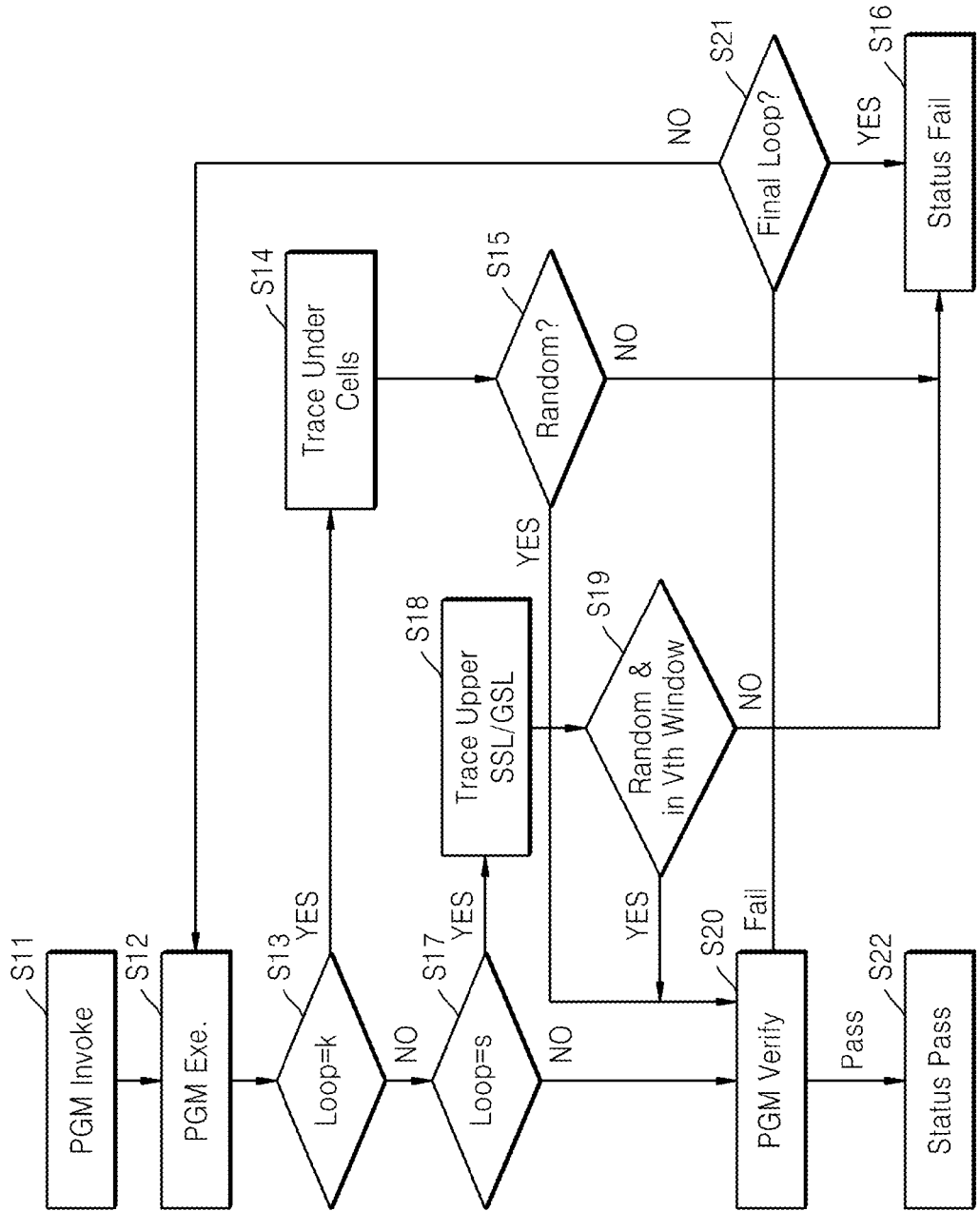
FIG. 14 is a flowchart illustrating processes of detecting a progressive defect during the writing operation.

FIG. 14 is a flowchart illustrating processes of detecting a progressive defect during the programming operation.

As shown in FIG. 14, when a programming command is applied (S11), programming operations are performed with respect to the memory cells connected to selected word line (S12). A plurality of programming operations may be performed, and it is determined whether the current programming loop is the programming operation of a certain order (for example, k-th programming operation) (S13).

If it is determined that the current programming loop is the k-th programming loop, a tracing operation of slow cells may be performed by analyzing distribution of threshold voltages of the memory cells according to the programming operation (S14). In addition, it is determined whether the progressive defect such as generation of a bridge occurs by determining whether the slow cells are randomly or evenly distributed (S15). If the slow cells are not evenly distributed, it is determined that the progressive defect occurs, P/F information representing the defect may be output (S16) (i.e., Status Fail). However, if the slow cells are evenly distributed, it is determined that the progressive defect does not occur, and accordingly, a program verifying operation may be performed (S20).

In addition, the tracing operation may be performed with respect to the cells connected to the string selection lines and the ground selection lines. The tracing operation may be performed in a k-th programming loop with respect to the cells connected to the string selection lines and the ground selection lines, or may be performed in another programming loop. In FIG. 14, an example is shown in which the tracing operation with respect to the cells connected to the string selection lines and the ground selection lines is performed when the programming operation is determined as an s-th programming loop.

It is determined whether the programming operation is the s-th programming loop (S17), and the tracing operation of the cells connected to the string selection lines and the ground selection lines is performed in the s-th programming loop. As described above, the threshold voltages of the cells connected to the string selection lines and the ground selection lines may be increased due to the HCI, and accordingly, the cells having the threshold voltages that are equal to or greater than a predetermined voltage level may be traced (S18). As a result of tracing, it may be determined whether the cells having the threshold voltages that are equal to or greater than a predetermined voltage level are randomly distributed, and/or whether the distribution of the threshold voltages is included in a predetermined window range (i.e., a Vth Window) (S19). If it is determined that the cells having the threshold voltages that are equal to or greater than a predetermined voltage level are not randomly distributed or if the threshold voltage distribution exceeds the predetermined window range, P/F information representing the progressive defect may be output (S16). However, if it is determined that the cells having the threshold voltages equal to or greater than the predetermined voltage level are randomly distributed or the threshold voltage distribution is included in the predetermined window range, a program verifying operation may be performed (S20).

In addition, after the program verifying operation, it may be determined whether the current programming loop is the final loop (S21). If the programming loop is the final loop and the programming verification fails, P/F information representing the failure may be output (S16). In addition, if the programming loop is not the final loop, the programming operation of a next loop is performed. Also, if the verification passes, information representing that the programming operation is normally performed may be output (S22).

Figure 15:
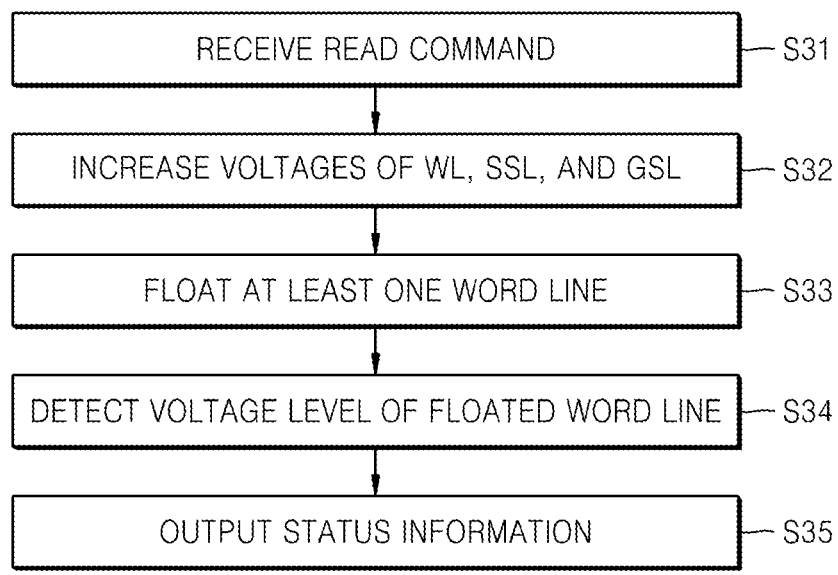
FIGS. 15 and 16 are flowcharts illustrating memory operations according to an embodiment of the present inventive concept.
Figure 16:
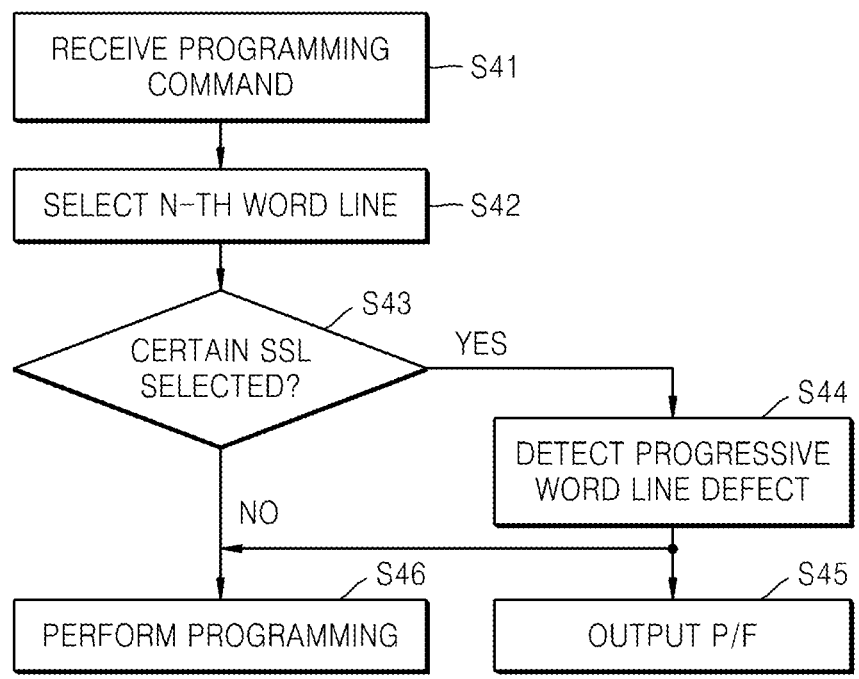

FIGS. 15 and 16 are flowcharts illustrating memory operations according to the embodiment of the present inventive concept. In FIG. 15, an operation of determining the progressive defect during a reading operation is shown, and in FIG. 16, an operation of determining the progressive defect during a programming operation is shown.

As shown in FIG. 15, when a reading command is received (S31), voltages are set up in order to perform reading operations with respect to the cells connected to a selected word line. For example, the voltage levels of the word line (including the normal and dummy word lines) and the string selection lines are increased (S32), for example, the voltage levels of the word lines may be increased to the reading voltage VREAD in the post-pulse section after finishing a sensing operation.

A leakage monitoring operation may be performed during a leakage monitoring section set in one or more sections between the receiving of the reading command and the finishing of the reading operation, and at least one of the word lines may be floated in the leakage monitoring section (S33). The voltage level of the floated word line is detected (S34), and status information (for example, P/F information representing whether the progressive defect occurs) according to the voltage level detection result may be output (S35).

As described in the above embodiment, the leakage monitoring section may be set variously, for example, the leakage monitoring operation may be performed in leakage monitoring sections corresponding to sections where the voltages of the selected word line and the unselected word lines are set up. Accordingly, the leakage caused by the bridge between the unselected word line that is set to the read voltage VREAD level and the selected word line that is set to the low level may be monitored.

FIG. 16 shows an operation of determining a progressive defect during a programming operation. As shown in FIG. 16, when a programming command is transmitted (S41), one or more word lines (for example, an n-th word line) that are to be programmed may be selected (S42). Due to the structure of the 3D NAND flash, a plurality of string selection lines may be disposed with respect to one word line, and the memory cells may be classified as a plurality of regions corresponding to the plurality of string selection lines. For example, the memory cells selected by one string selection line may be defined as one page, and accordingly, the memory cells of a plurality of pages may be disposed to correspond to one word line.

When the n-th word line is selected, one of the plurality of string selection lines is selected. It may be determined whether the currently selected string selection line is a certain string selection line having a voltage level which is already set up (S43). If it is determined that the certain string selection line is selected, the operation of detecting the progressive word line defect according to the previous embodiment may be performed (S44). Also, a P/F signal according to the detection operation may be output (S45). The programming operation may be performed with respect to the memory cells corresponding to the selected word line and the string selection line, with the operation of detecting the progressive word line defect (S46).

The programming operation may be performed while changing the word line physically. According to the embodiment of FIG. 16, the operation of detecting the progressive word line defect may be performed with respect to each of the word lines. For example, the operation of detecting the progressive word line defect may be performed when at least one string selection line is selected in one word line layer. If first through eighth string selection lines SSL0 through SSL7 correspond to one word line, the operation of detecting the progressive word line defect may be performed when one or more of the first through eighth string selection lines SSL0 through SSL7 are selected. For example, the operation of detecting the progressive word line defect may be performed when selecting the first string selection line SSL0 and the last (eighth) string selection line SSL7.

Figure 17:
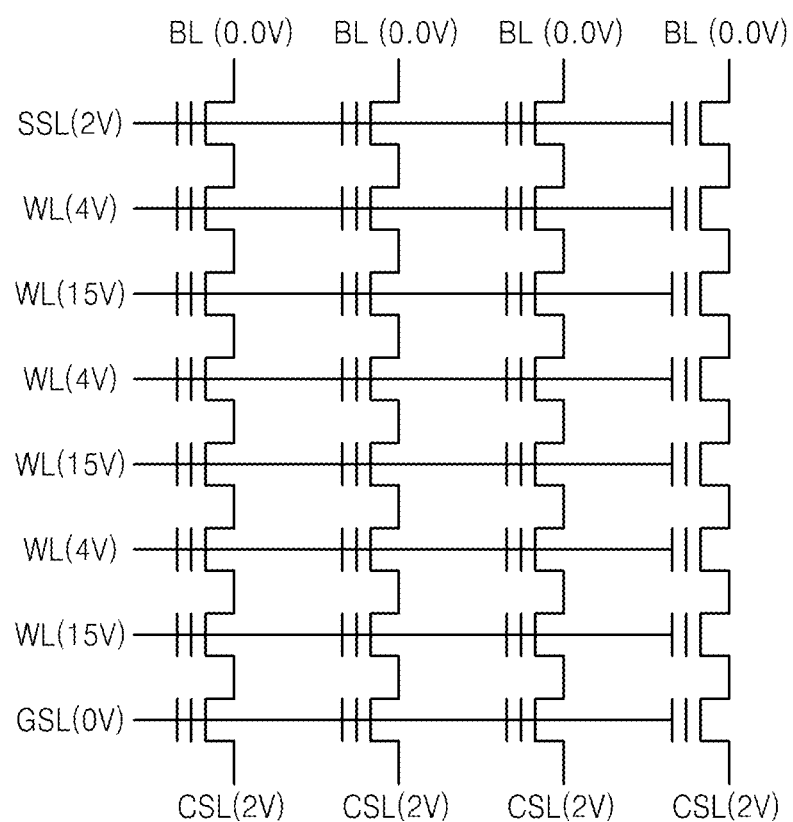
FIG. 17 is a circuit diagram illustrating a method of operating a memory device according to another embodiment of the present inventive concept.

FIG. 17 is a circuit diagram illustrating a method of operating a memory device according to another embodiment of the present inventive concept. FIG. 17 shows an example of determining a progressive defect in an erasing operation.

In the operation of the memory device, the operation of detecting the progressive defect may be performed in the erasing operation. When performing the erasing operation, a pre-programming operation may be performed to increase the threshold voltages of at least some of the cells by a predetermined amount. At least some of the plurality of word lines included in one memory block are selected, and then, voltages of a programming voltage level may be applied thereto. For example, one memory block is divided into at least two regions in order to detect whether the bridge is generated between the word lines, and then, the pre-programming operation with respect to the word line may be performed in each of the regions. In the example of FIG. 17, one memory block is divided into odd word lines and even word lines, and the pre-programming operation is performed with respect to the odd/even word lines.

A voltage of the programming voltage level (for example, 15 V) is applied to the word line, for which the pre-programming operation will be performed (for example, selected word line), and a voltage of relatively low level (for example, 4 v) is applied to the unselected word line. Also, a voltage of 2 V may be applied to the string selection line, and a voltage of 0 V may be applied to the ground selection line. When the voltage levels of the word lines are set up as described above, the leakage may be detected by monitoring dropping of the voltage of the programming voltage level, according to the operation of detecting the voltage level of the previous embodiment.

Since the memory cells connected to all of the word lines are programmed in the pre-programming operation, a program disturbance of an unselected string selection line does not occur, and a voltage having a voltage level that is less than the pass voltage Vpass is applied to unselected word line. Thus, a bridge generated between the word lines may be found. According to another embodiment of the present inventive concept, all of the memory cells are programmed in the pre-programming operation, and then, locations of slow cells are determined by analyzing the distribution of the memory cells as described in the above embodiment to detect the bridge between the word lines. If the slow cells are concentrated in one word line, it may be determined that the bridge is generated in the one word line.

Figure 18A:
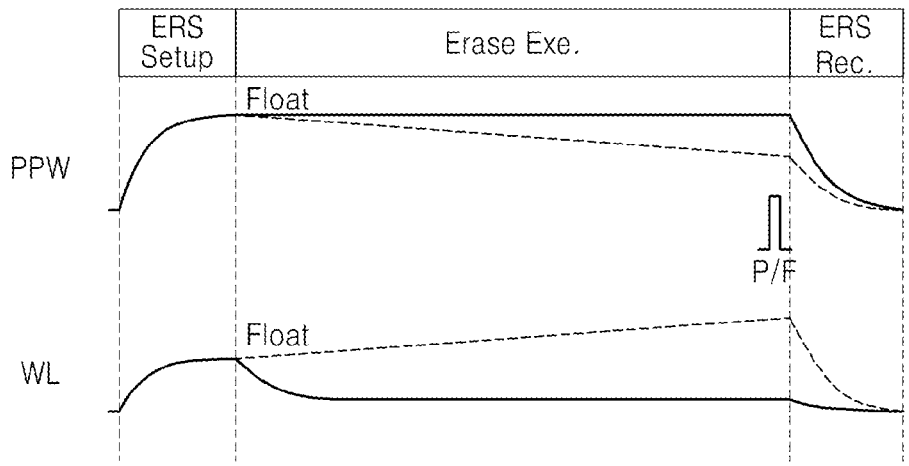
FIGS. 18A, 18B, and 18C are diagrams showing examples of determining progressive defects in the erasing operation.
Figure 18B:
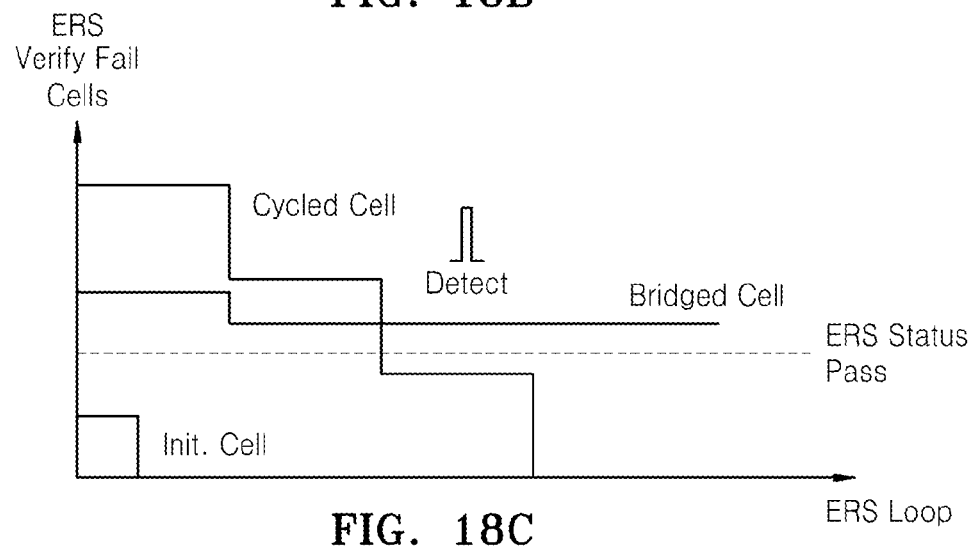
Figure 18C:
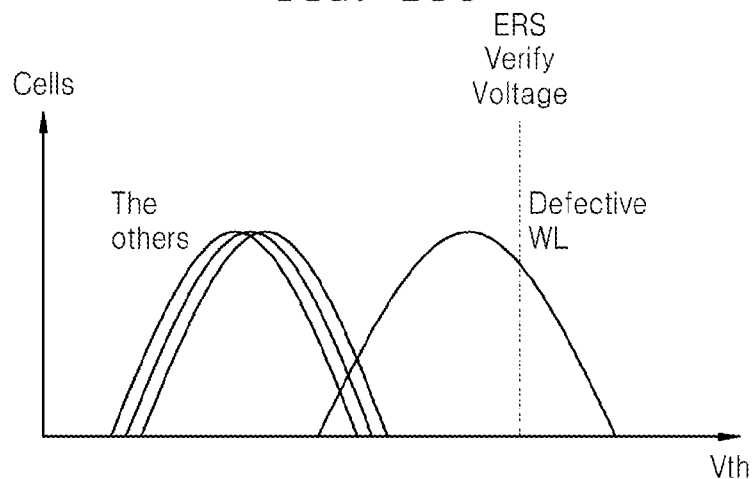

FIGS. 18A, 18B, and 18C are diagrams showing examples of determining progressive defects in the erasing operation.

The progressive defect may be detected by determining whether a reduction in the erasing speed due to the bridge that is gradually generated between the word lines and the channel (or the common source line) occurs. When the erasing operation is performed, an electric field is formed between the word line and the channel with a potential difference of about 15 V to perform the erasing operation. If the word line bridge is generated, the potential difference between the word line and the channel is reduced, and accordingly, the erasing operation may be finished only after performing a plurality of erasing loops. When the above processes are repeated, the erasing operation may fail, or the writing operation may fail and the data may be lost.

Referring to FIG. 18A, after setting up erasing voltages and floating the word lines in the erasing operation, it may be determined whether the corresponding voltages are maintained for a long time or distribution of threshold voltage may be determined. When the erasing voltages are set up, the word line voltage has a level of about 0.3 V, and a P well (PPW) may have a voltage of about 20 V. The erasing voltages may be floated while performing the erasing operation. FIG. 18A shows an example in which the floating operation is performed immediately after setting up the erasing voltages; however, the floating operation may be performed at an intermediate stage or a final stage of the erasing operation. After the floating operation, if the voltage level of the P well (PPW) decreases and the word line voltage increases, it may be determined that the progressive defect has occurred.

In addition, referring to FIG. 18B, the erasing failure is identified through the distribution analysis every time the erasing loop is performed so as to determine whether an insufficient erasing operation has occurred due to degradation of the memory cell or because generation of the word line bridge. If the degraded cells are evenly distributed in all word lines, the number of cells in which verification failure occurs is gradually reduced whenever the erasing loop is performed. However, if the bridge is generated in one of the word lines, the number of cells in which the verification failure occurs remains constant even when the erasing loops are performed continuously. In FIG. 18B, an example is shown in which the number of cells in which the verification failure occurs remains constant after a second erasing loop, and in this case, it may be determined that the erasing operation may not be performed well due to the word line bridge.

In addition, referring to FIG. 18C, the progressive defect may be detected by performing a verification of the erasing operation with respect to each of the word lines and analyzing distribution of the threshold voltages after the erasing operation. For example, as shown in FIG. 18C, if one of the word lines has a defect, the threshold voltages in other word lines are less than a predetermined verification voltage, while the distribution of the threshold voltages of a certain word line has a point that is greater than the predetermined verification voltage, it may be determined that the progressive defect has occurred in the certain word line. A plurality of erasing loops may be performed, and the verification operation for each of the word lines may be performed after performing a certain erasing loop. For example, the verification operation for each of the word lines may be performed after performing a first erasing loop.

Figure 19:
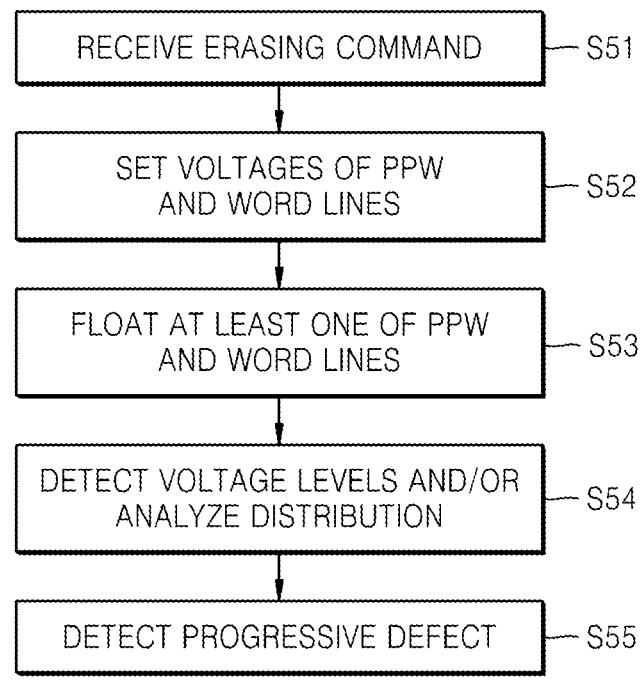
FIG. 19 is a flowchart illustrating a method of detecting a progressive defect in an erasing operation, according to an embodiment of the present inventive concept.

FIG. 19 is a flowchart illustrating a method of detecting a progressive defect in an erasing operation, according to an embodiment of the present inventive concept.

As described above, the progressive defect may be detected while performing the erasing operation. For example, as shown in FIG. 19, an erasing command is received (S51), and then, a setting operation is performed with respect to the voltages applied to the word lines and the P well (PPW) according to the erasing operation mode (S52).

As shown in FIG. 17, the plurality of word lines may be divided into at least two regions, and different word lines voltages may be applied respectively to the word lines included in the two regions. As shown in FIG. 17, after setting up the word line voltages and floating at least one word line, the voltage level of the word line may be detected (S53). According to the voltage level detection result, the progressive defect may be detected.

In addition, as shown in FIG. 18A, the voltage setting operation with respect to the P well or the word lines is performed and the P well or the word lines are floated in the erasing operation, and then, the voltage levels may be detected (S53). As described above, the progressive defect may be detected by monitoring the variation in voltages of the P well or the word lines.

In addition, as shown in FIGS. 18B and 18C, the progressive defect may be detected by analyzing distribution of threshold voltages after performing the erasing loops (S54 and S55). That is, the progressive defect may be detected by detecting the distribution of the cells, in which the verification failure has occurred, whenever the erasing loop is performed. Otherwise, the progressive defect may be detected by detecting the distribution of the cells in which the verification failure has occurred in each of the word lines, after performing a certain erasing loop.

Figure 20:
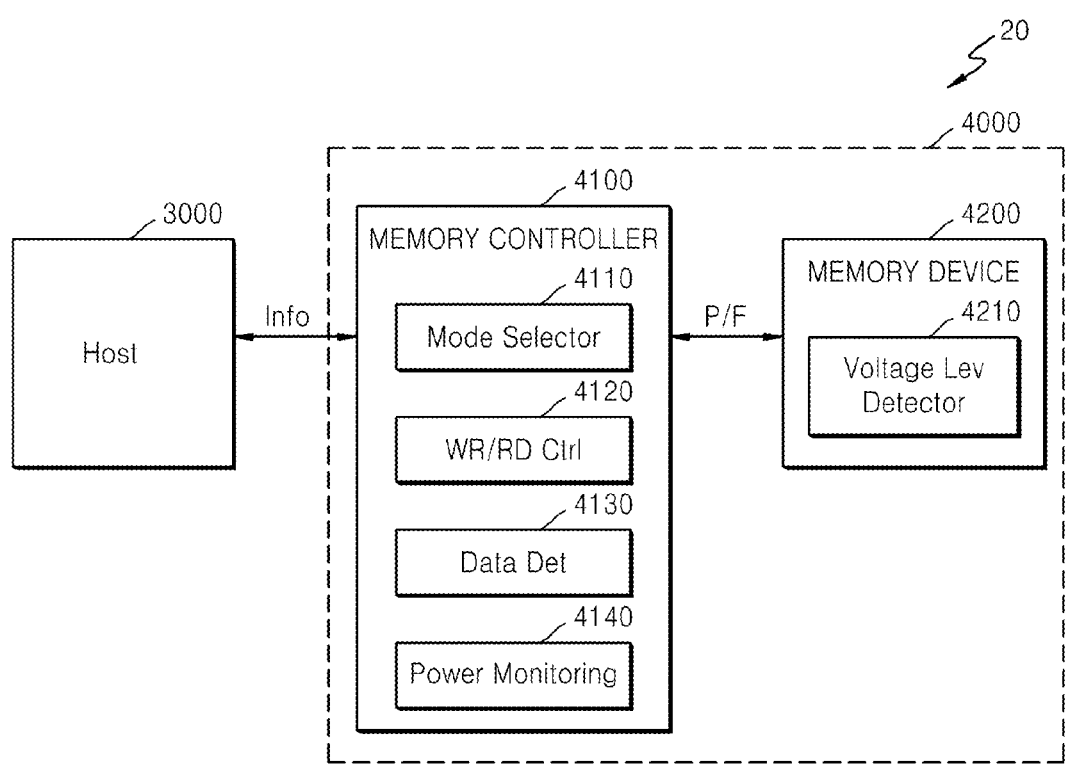
FIG. 20 is a block diagram of a system for detecting a progressive defect in a memory device, according to an embodiment of the present inventive concept.

FIG. 20 is a block diagram of a system for detecting a progressive defect in a memory device, according to an embodiment of the present inventive concept. As shown in FIG. 20, a system 20 (for example, a mobile device such as a smartphone or a tablet) adopting a memory system 400 may include a host 300. Based on a request from the host 300, a memory controller 410 of the memory system 400 may perform operations in a user mode, for example, writing operations, reading operations and erasing operations, with respect to a memory device 420.

The host 300 and the memory system 400 may transmit/receive various kinds of information to/from each other. For example, the host 300 may provide the memory system 400 with metadata having information related to user data, as well as the user data that is to be programmed. The memory system 400 controls performing of the memory operation corresponding to the request from the host 300, and may detect whether the progressive defect is generated in the memory device 420 and provide defect information representing whether the progressive defect has occurred to the host 300.

The memory controller 410 may include a mode selection unit 411, a writing/reading controller 412, a data determiner 413, and a power monitoring unit 414. Also, the memory device 420 may include a voltage level detector 421. The writing/reading controller 412 may control writing, reading, and erasing operations with respect to the memory device 420, and the data determiner 413 may perform the data determination to analyze the distribution of the threshold voltages in the word lines of the memory device 420. In addition, the voltage level detector 421 detects variation in the voltage levels of the word lines (including the string selection lines, the normal/dummy word lines, and the ground selection lines) to detect whether the progressive defect has occurred in the word lines. P/F information according to the detection result may be transmitted between the memory controller 410 and the memory device 420.

The memory cell array (not shown) of the memory device 420 may include a plurality of memory blocks. The plurality of memory blocks may include blocks storing core management information or security in a FAT and the memory system 400, which is used by the memory controller 410, or blocks (for example, meta blocks) storing information for managing an entire chip, as well as data blocks storing user data. With respect to the meta blocks, reliability of principal data needs to be improved by detecting the word line defects at an early stage.

The mode selection unit 411 may select whether a reliability mode will be performed according to importance of the data. That is, the reliability mode may be selected according to rules set by the system 20 adopting the memory system 400, or rules regulated by the memory system 400. In the reliability mode, the above described operation of detecting the progressive word line defects as in the user mode such as the writing, reading, and erasing operations may be performed. For example, the leakage monitoring operation may be performed after setting up voltages in the reading operation, or the voltage level detection may be performed whenever the word line is changed or by analyzing distribution of the slow cells in the writing operation.

It may be set various whether to select the reliability mode in the system 20. For example, the reliability mode may be selected in a case where data to be accessed is determined as important data with reference to meta data as information provided from the host 300. Otherwise, the reliability mode may be selected in connection with the number of times of performing the writing/reading operations in the memory block because the progressive defects may increase according to the number of accessing times to the memory block. Otherwise, the reliability mode may be randomly selected to prevent the defective data.

In addition, from among the plurality of memory blocks included in the memory cell array (not shown) of the memory device 420, the blocks in which defects are generated, for example, the writing/reading operations are not performed, need to be processed as bad blocks. The operation of detecting the progressive defect according to the embodiments of the present inventive concept may be performed to perform the bad block process.

For example, when data is read, read retry is actually necessary due to endurance of the memory or data retention characteristics. However, the reading may not succeed on an endurance pre-determined table (PDT), and a complicated read retry such as a retention PDT or swing may be necessary. In this case, the operation of detecting the progressive defect according to the embodiments of the present inventive concept may be performed to determine whether there is the progressive word line defect in the corresponding memory block, and according to the determination result, the corresponding memory block may be processed as a bad block.

The power monitoring unit 414 may monitor operating power of the memory system 400 by a block unit or a mode unit. The power monitoring unit 414 monitors the memory block causing a difference between power consumptions of the word lines or blocks, and may process the memory block as a bad block. In a case of leakage from the word line, charges supplied from a pump are leaked, and thus, even the word line leakage of tens of µA may be represented as a power defect of hundreds to a few mA in consideration of a pump efficiency of a few %. Thus, the bad block may be detected.

Figure 21:
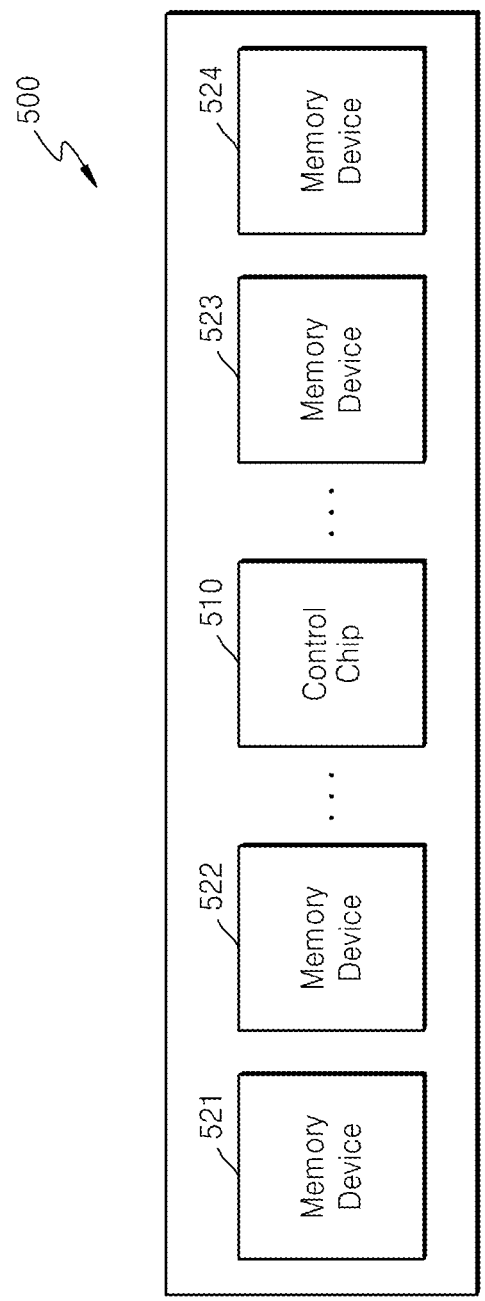
FIG. 21 is a diagram of a memory module according to an embodiment of the present inventive concept.

FIG. 21 is a diagram of a memory module 500 according to an embodiment of the present inventive concept. Referring to FIG. 21, the memory module 500 may include memory chips 521 to 524 and a control chip 510. The memory chips 521 through 524 may store data. For example, the memory chips 521 through 524 each may be the memory device 200 of FIG. 1. The control chip 510 may control the memory chips 521 through 524 in response to various signals transmitted from an external memory controller. For example, the control chip 510 may activate the memory chips 521 through 524 corresponding to a chip selection signal transmitted from outside, and may perform an error checking operation and a correcting operation with respect to data read from each of the memory chips 521 through 524.

According to the embodiment of the present inventive concept, the progressive defect may be detected from the memory chips 521 through 524. When detecting the progressive word line defect, the voltage level detection or the distribution analysis may be performed, and the above operation of detecting the progressive defect may be performed in the control chip 510. The control chip 510 may generate P/F signals according to the detection results.

Figure 22:
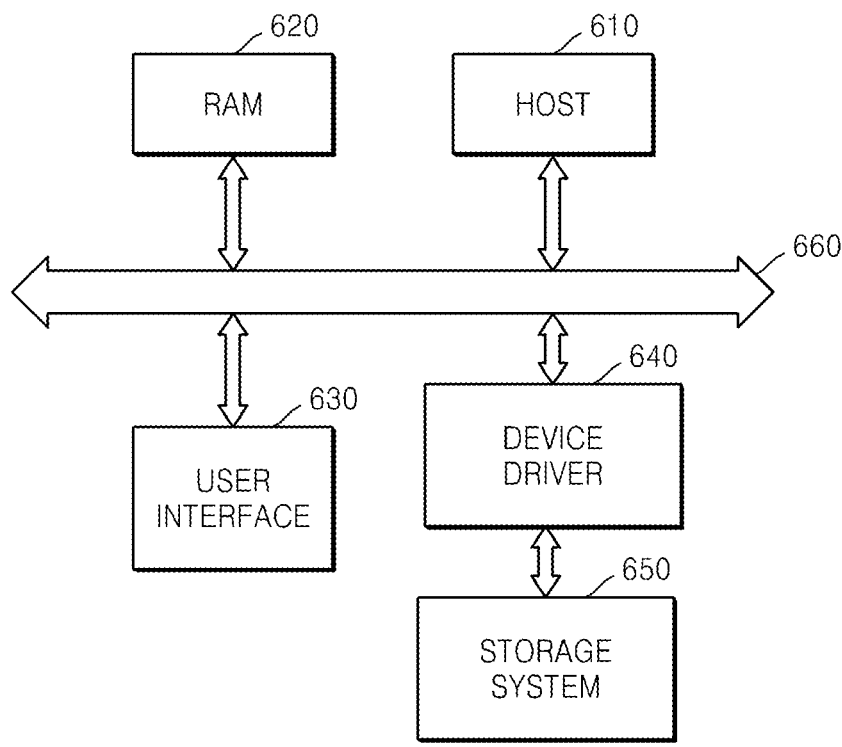
FIG. 22 is a block diagram of a computing system including a non-volatile memory system according to an embodiment of the present inventive concept.

FIG. 22 is a block diagram of a computing system 600 including a non-volatile memory system according to an embodiment of the present inventive concept. The computing system 600 according to the embodiment of the present inventive concept may be a mobile device or a desk top computer, and may include a host 610 including a central processor unit (CPU), a random access memory (RAM) 620, a user interface 630, and a device driver 640. In addition, the above elements are electrically connected to a bus 660. A non-volatile storage system 650 may be connected to the device driver 640. The host 610 controls the entire computing system 600 and performs calculation corresponding to a user's command input through the user interface 630. The RAM 620 acts as a data memory of the host 610, and the host 610 may record or read user data into/from the non-volatile storage system 650 via the device driver 640. Also, the device driver 640 for controlling operations and management of the non-volatile storage system 650 is disposed on an outside of the host 610 in FIG. 22; however, the device driver 640 may be provided in the host 610. The non-volatile storage system 650 may include the memory device 200 of FIG. 1.

Figure 23:
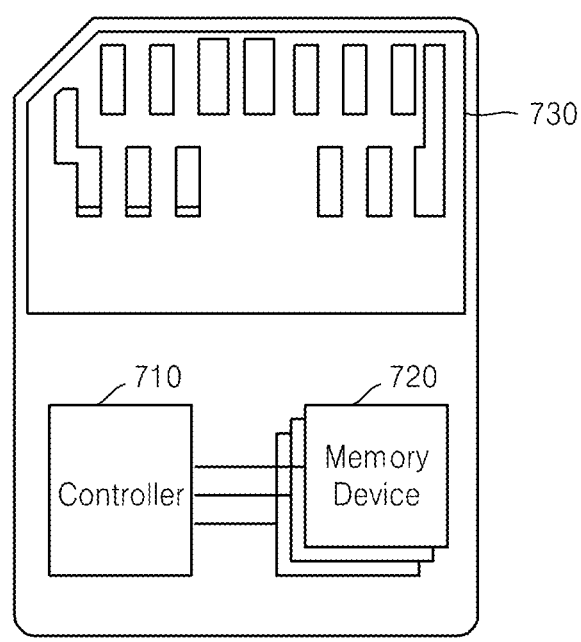
FIG. 23 is a diagram of a memory card according to an embodiment of the present inventive concept.

FIG. 23 is a diagram of a memory card 700 according to an embodiment of the present inventive concept. The memory card 700 may be a portable storage device that may be connected to an electronic device such as a mobile device or a desk top computer. As shown in FIG. 23, the memory card 700 may include a memory controller 710, a memory device 720, and a port region 730. The memory card 700 may communicate with an external host (not shown) via the port region 730, and may control the memory device 720. The memory controller 710 may execute programs by reading the programs from a ROM (not shown) storing the programs.

Figure 24:
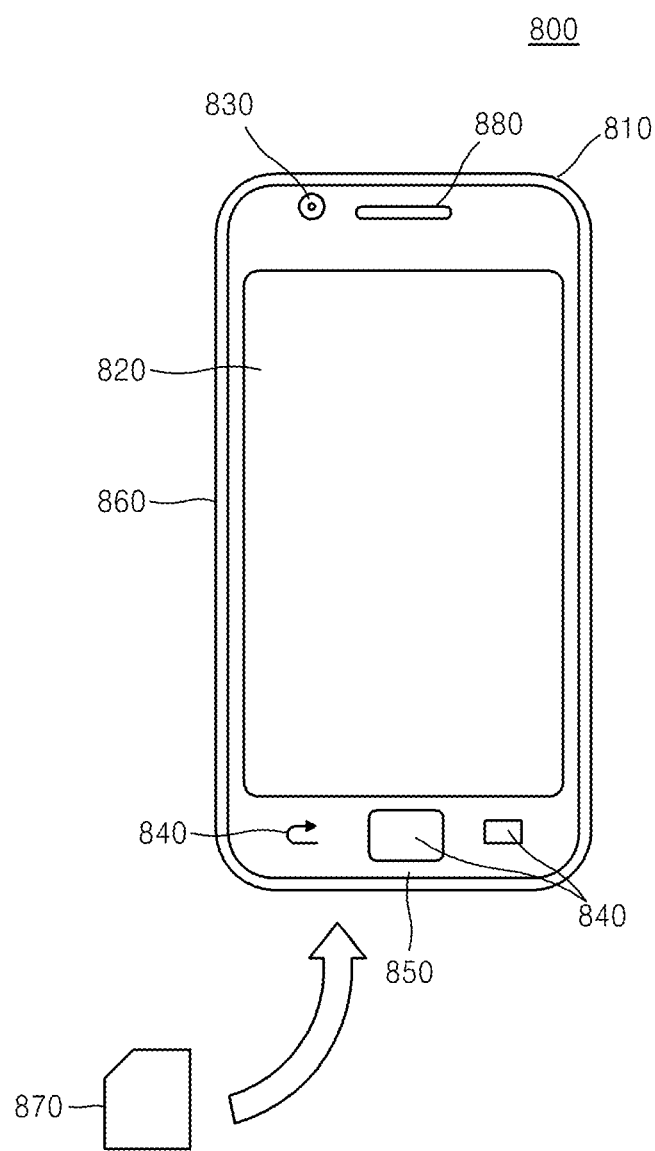
FIG. 24 is a diagram of a mobile terminal adopting a memory system according to an embodiment of the present inventive concept.

FIG. 24 is a diagram of a mobile terminal 800 adopting a memory system according to the embodiment of the present inventive concept. The mobile terminal 800 of FIG. 24 may include the memory system according to one of the embodiments of the present inventive concept. The mobile terminal 800 may be a smartphone that is capable of changing or expanding functions thereof by using application programs. The mobile terminal 800 includes an internal antenna 810 for exchanging radio frequency (RF) signals with a wireless base station, and a display screen 820 such as a liquid crystal display (LCD) or an organic light-emitting diode (OLED) for displaying images captured by a camera 830 or images received via the antenna 810 and decoded. The mobile terminal 800 may include an operating panel 840 including a control button and a touch panel. Also, if the display screen 820 is a touch screen, the operating panel 840 may further include a touch sensing panel for sensing a touch on the display screen 820. The mobile terminal 800 may include a speaker 880 or another kind of sound output unit for outputting voice and sound, and a microphone 850 or another kind of sound input unit for inputting voice and sound. The mobile terminal 800 may further include the camera 830 such as a charge-coupled device (CCD) camera for capturing video and still images. Also, the mobile terminal 800 may include a storage medium 870 for storing encoded or decoded data, for example, video or still images that are captured by the camera 830, received via an E-mail, or obtained in another manner, and a slot 860 for mounting the storage medium 870 on the mobile terminal 800. The storage medium 870 may include the memory device 200 of FIG. 1.

While the inventive concept has been particularly shown and described with reference to exemplary embodiments thereof, it will be understood that various changes in form and details may be made therein without departing from the spirit and scope of the following claims.

What is claimed is:

1. A non-volatile memory device comprising:
   a memory cell array connected to a plurality of word lines, and comprising a plurality of memory cells that are respectively connected to the plurality of word lines;
   a voltage generator providing the memory cell array with word lines voltages, when a user operation is performed according to at least one mode selected from among a writing mode, a reading mode, and an erasing mode with respect to the memory cell array; and
   a voltage level detector detecting a voltage level of at least one word line that is floated according to the at least one selected mode, and generating a detection result representing whether the at least one word line has a progressive defect; and
   a data determiner, wherein
   the data determiner, if the writing mode is selected, is configured to determine a distribution of slow cells based on analyzing a distribution of threshold voltages of memory cells connected to the at least one word line, and at least one of,
      the data determiner is configured to determine the at least one word line does not have the progressive defect if the slow cells are evenly distributed in the at least one word line, and
      the data determiner is configured to determine the at least one word line has the progressive defect, if a number of the slow cells rapidly increases in a certain location of the at least one word line.

2. The non-volatile memory device of claim 1, wherein the memory cell array comprises three-dimensional (3D) VNAND memory cells, and
   the voltage generator, when the reading mode is selected, is configured to perform the reading mode to include a set up section for setting up the voltages and one or more sensing sections for sensing data, and a leakage monitoring section for detecting the progressive defect is inserted into the reading mode and performed after the set up section.

3. The non-volatile memory device of claim 1, further comprising a data determiner,
    wherein when the user operation of a first mode is selected, it is determined whether the at least one word line has the progressive defect, according to a result of detecting a voltage level of the at least one floated word line.

4. The non-volatile memory device of claim 1, wherein
    the plurality of memory cells in the memory call array are 3D VNAND memory cells,
    the memory cell array includes a plurality of cell strings,
    each of the cell strings includes a plurality of the 3D VNAND memory cells stacked on top of each other between a ground selection transistor and a string selection transistor, and
    the 3D VNAND memory cells, ground selection transistor, and string selection transistor each include a charge trap flash structure.

5. A method of operating a non-volatile memory device, the method comprising:
    entering a writing mode with respect to a memory cell array;
    after performing predetermined writing loops, analyzing a distribution of threshold voltages of memory cells that are connected to one or more word lines;
    determining a distribution of slow cells according to a result of the analyzing the distribution of the threshold voltages;
    generating information representing whether the one or more word lines have a progressive defect, according to a result of the determining the distribution of the slow cells; and
    determining whether the one or more word lines have the progressive defect based on the distribution of the slow cells, the determining whether the one or more word lines have the progressive defect including one of,
        determining the one or more word lines do not have the progressive defect in response to the slow cells being evenly distributed in the one or more word lines, or
        determining the one or more word lines have the progressive defect, if in response to a number of the slow cells rapidly increasing in a certain location of the one or more word lines.

6. The method of claim 5, wherein when data of 2 bits or more is programmed in each of the memory cells in the memory cell array, the analyzing of the distribution of the threshold voltages includes performing the analyzing according to a result of identifying whether a current writing loop is a k-th writing loop, wherein k is an integer of 1 or greater.

7. The method of claim 5, further comprising:
    entering an erasing mode of the memory cell array;
    detecting voltage levels of the one or more word lines; and
    detecting the progressive defect in at least one word line among the one or more word lines, according to the detecting of the voltage levels of the one or more word lines.

8. The method of claim 5, further comprising:
    entering an erasing mode with respect to the memory cell array;
    analyzing the distribution of threshold voltages of the memory cells that are connected to one or more word lines, when an erasing loop is performed; and
    detecting the progressive defect according to a result of detecting a variation in a total number of memory cells in which verification failures have occurred in a same word line, or according to a result of comparing, among different word lines, a total number of memory cells in which verification failures have occurred.

9. The method of claim 5, wherein
    the memory cell array includes a plurality of cell strings,
    each of the cell strings includes a plurality of 3D VNAND memory cells stacked on top of each other between a ground selection transistor and a string selection transistor, and
    the 3D VNAND memory cells, ground selection transistor, and string selection transistor each include a charge trap flash structure.

10. The method of claim 5,
    wherein a plurality of regions correspond to one word line,
    wherein the determining the distribution of slow cells includes analyzing differences between bit error rates of the plurality of regions, and
    determining whether the number of the slow cells rapidly increases is based on analyzing the differences.

* * * * *